[12] United States Patent
Van Dal et al.

(10) Patent No.: US 10,770,358 B2
(45) Date of Patent: Sep. 8, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Mark Van Dal, Linden (BE); Gerben Doornbos, Kessel-Lo (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/201,694

(22) Filed: Nov. 27, 2018

(65) Prior Publication Data
US 2019/0131181 A1 May 2, 2019

Related U.S. Application Data

(62) Division of application No. 15/798,227, filed on Oct. 30, 2017.

(51) Int. Cl.
H01L 29/66 (2006.01)
H01L 21/8238 (2006.01)
(Continued)

(52) U.S. Cl.
CPC ........ H01L 21/823807 (2013.01); H01L 21/823412 (2013.01); H01L 21/823418 (2013.01); H01L 21/823814 (2013.01); H01L 21/823821 (2013.01); H01L 21/823828 (2013.01); H01L 27/0886 (2013.01); H01L 27/0924 (2013.01); H01L 29/42392 (2013.01);
(Continued)

(58) Field of Classification Search
CPC combination set(s) only.
See application file for complete search history.

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 10-2014-0099306 A 8/2014
WO 2013095647 A1 6/2013
WO 2016/209278 A1 12/2016

OTHER PUBLICATIONS

Non-final Office Action issued in related U.S. Appl. No. 15/798,227, dated Feb. 26, 2019.
(Continued)

Primary Examiner — Moin M Rahman
(74) Attorney, Agent, or Firm — McDermott Will & Emery LLP

(57) ABSTRACT

In a method of manufacturing a semiconductor device, a fin structure having a bottom portion, an intermediate portion disposed over the bottom portion and an upper portion disposed over the intermediate portion is formed. The intermediate portion is removed at a source/drain region of the fin structure, thereby forming a space between the bottom portion and the upper portion. An insulating layer is formed in the space. A source/drain contact layer is formed over the upper portion. The source/drain contact layer is separated by the insulating layer from the bottom portion of the fin structure.

20 Claims, 33 Drawing Sheets

(51) Int. Cl.
  *H01L 27/088* (2006.01)
  *H01L 29/786* (2006.01)
  *H01L 27/092* (2006.01)
  *H01L 29/423* (2006.01)
  *H01L 29/78* (2006.01)
  *H01L 21/8234* (2006.01)
  *H01L 21/02* (2006.01)

(52) U.S. Cl.
  CPC .. *H01L 29/66439* (2013.01); *H01L 29/66545* (2013.01); *H01L 29/66795* (2013.01); *H01L 29/785* (2013.01); *H01L 29/78618* (2013.01); *H01L 29/78654* (2013.01); *H01L 29/78684* (2013.01); *H01L 29/78696* (2013.01); *H01L 21/0245* (2013.01); *H01L 2029/7858* (2013.01)

(56) References Cited

U.S. PATENT DOCUMENTS

| | | |
|---|---|---|
| 9,391,204 B1 | 7/2016 | Cheng et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2002/0158338 A1 | 10/2002 | Ohtsuka et al. |
| 2005/0194616 A1 | 9/2005 | Yoon et al. |
| 2012/0138886 A1 | 6/2012 | Kuhn et al. |
| 2013/0161729 A1 | 6/2013 | Xie |
| 2013/0341704 A1 | 12/2013 | Rachmady et al. |
| 2014/0239399 A1 | 8/2014 | Nagumo |
| 2014/0264600 A1 | 9/2014 | Adam et al. |
| 2015/0021691 A1 | 1/2015 | Akarvardar et al. |
| 2015/0028348 A1 | 1/2015 | Jacob et al. |
| 2015/0294912 A1 | 10/2015 | Xie et al. |
| 2015/0340272 A1 | 11/2015 | Chen et al. |
| 2016/0190325 A1* | 6/2016 | Liu ............ H01L 29/785 257/401 |
| 2017/0025537 A1 | 1/2017 | Ching et al. |
| 2017/0053981 A1 | 2/2017 | Loubet et al. |
| 2017/0278747 A1* | 9/2017 | Adusumilli ....... H01L 21/76897 |
| 2018/0248014 A1 | 8/2018 | Leobandung |
| 2019/0067474 A1* | 2/2019 | Wong ............ H01L 29/7827 |

OTHER PUBLICATIONS

Non-final Office Action issued in related U.S. Appl. No. 15/798,227, dated Mar. 5, 2020.

Final Office Action issued in related U.S. Appl. No. 15/798,227, dated Sep. 3, 2019.

Non-Final Office Action issued in corresponding U.S. Appl. No. 16/585,313, dated Apr. 29, 2020.

\* cited by examiner

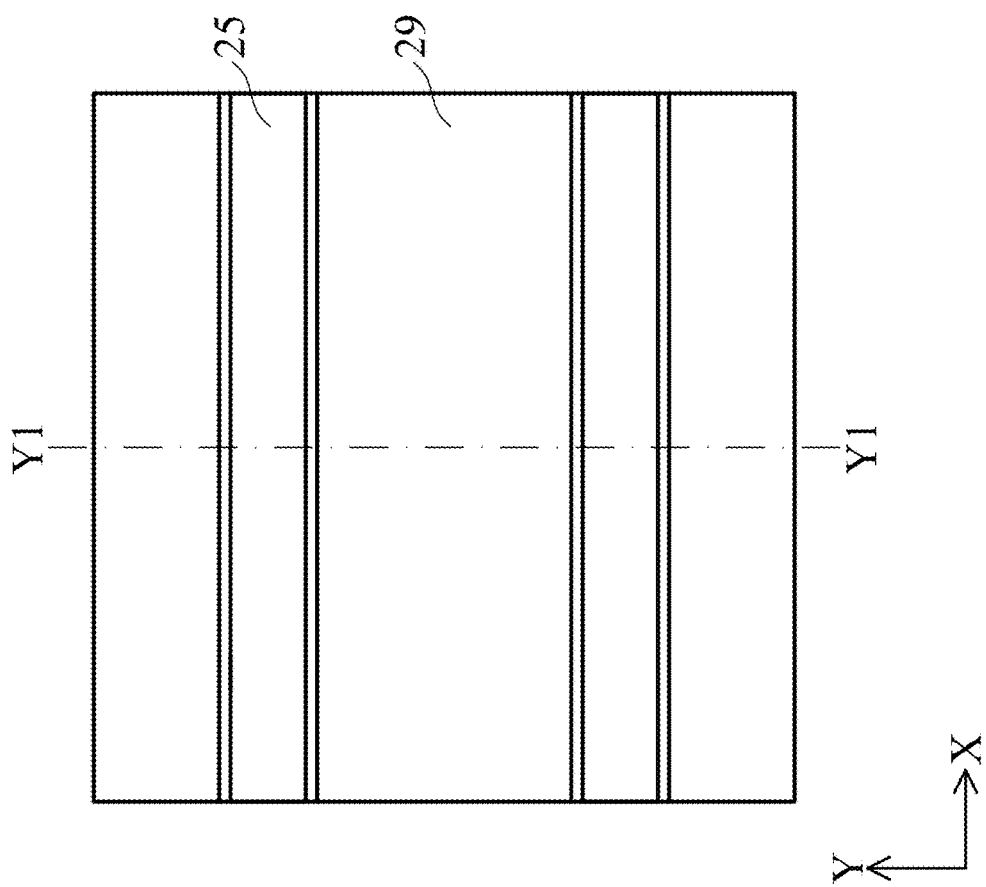
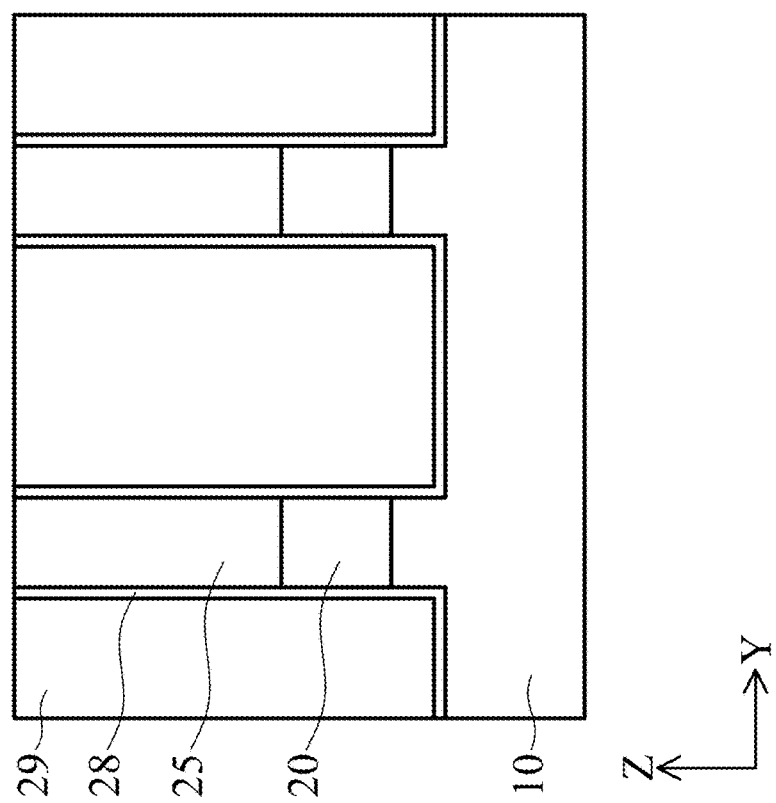
FIG. 3B
FIG. 3A

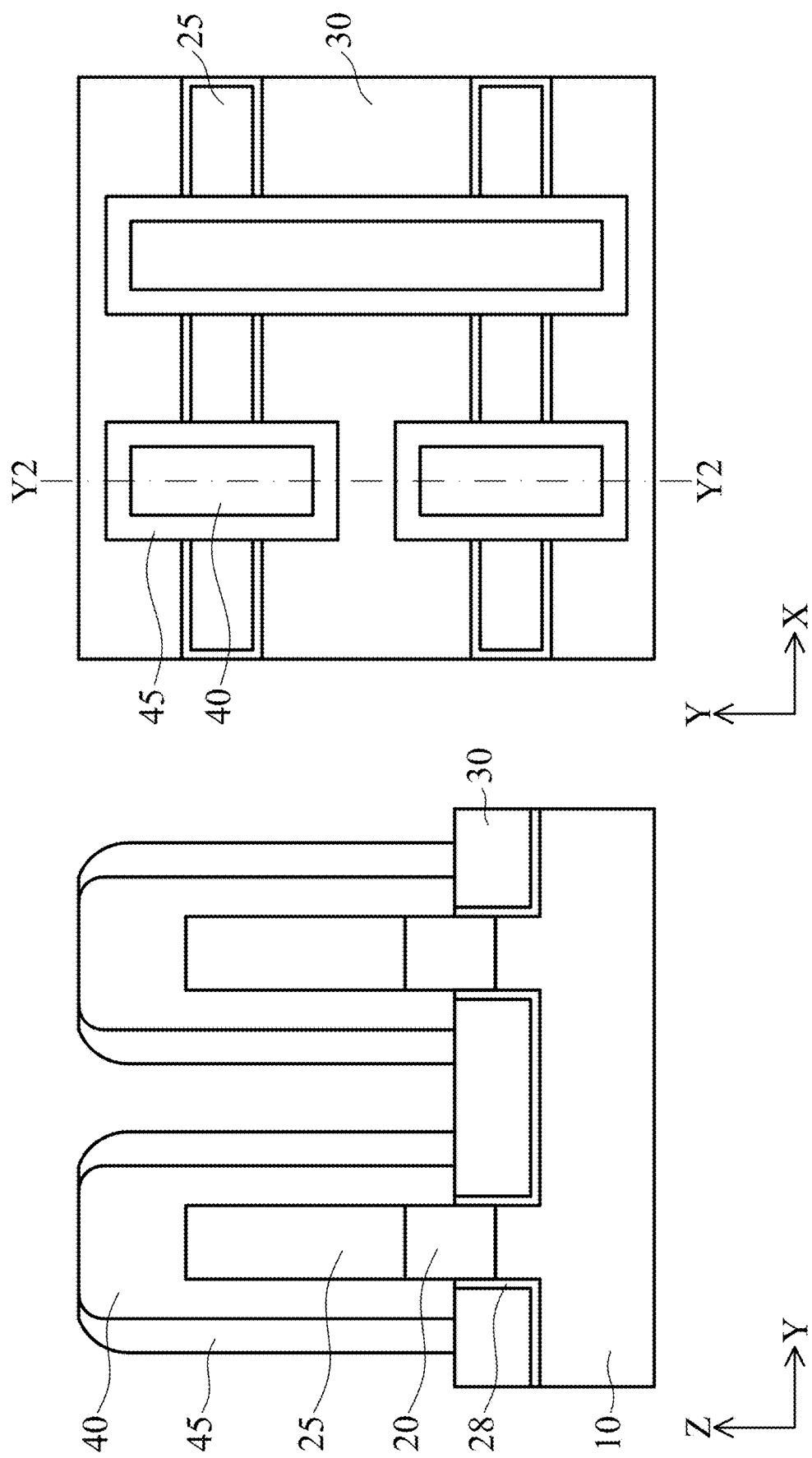

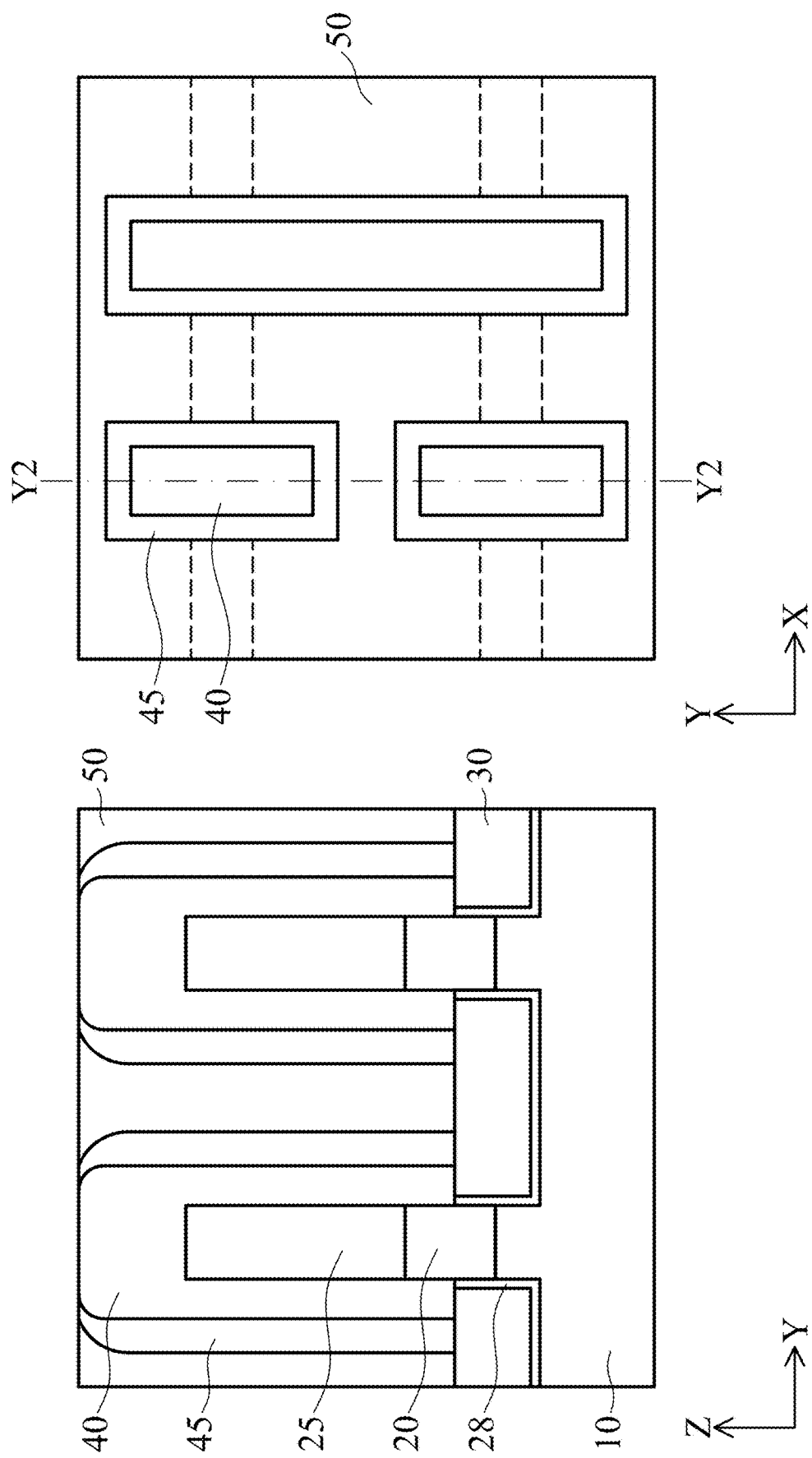

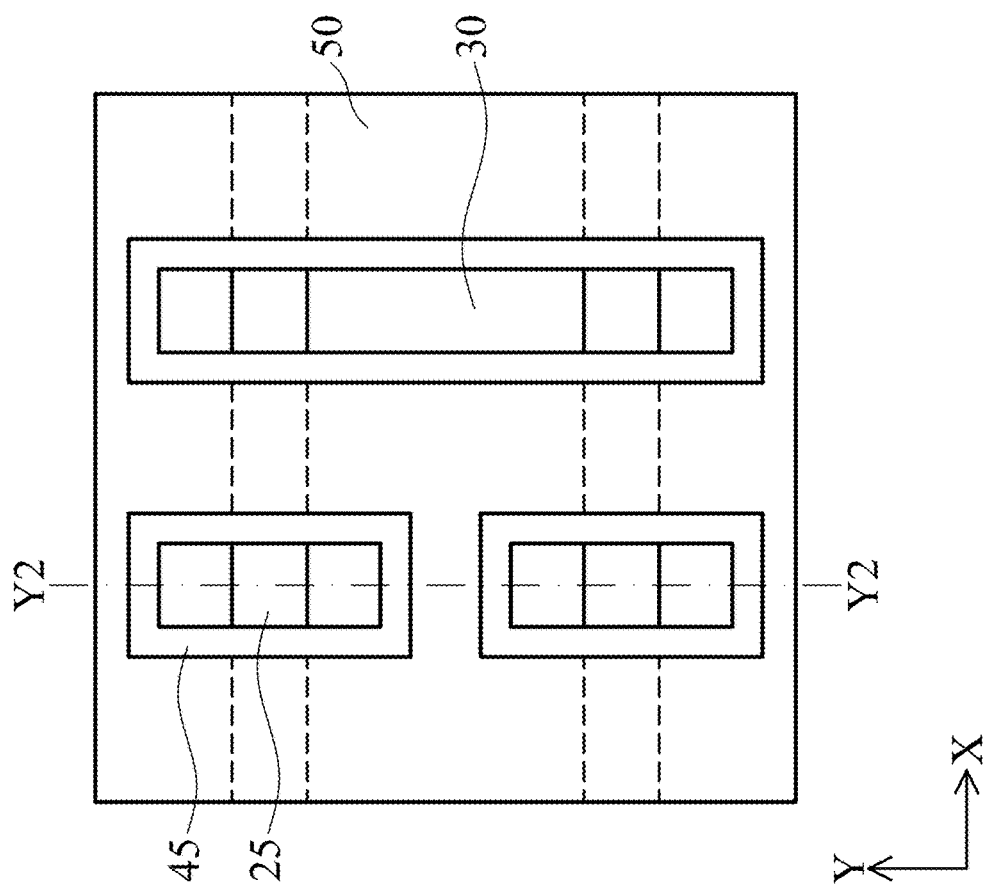
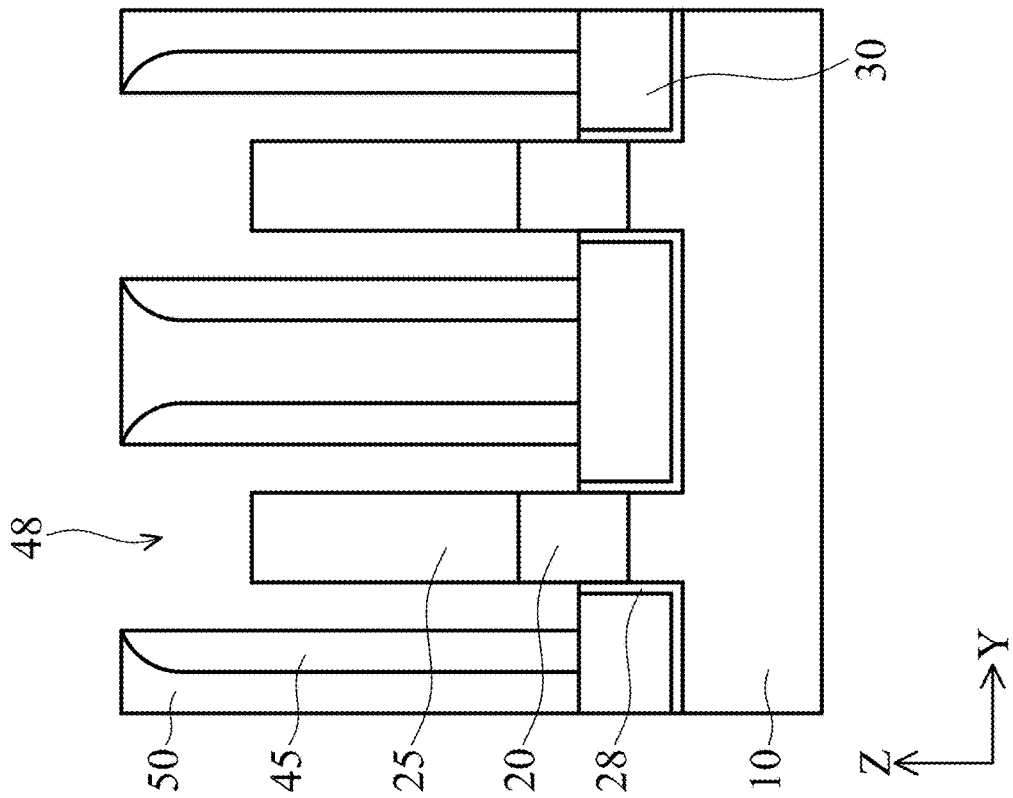
FIG. 8B
FIG. 8A

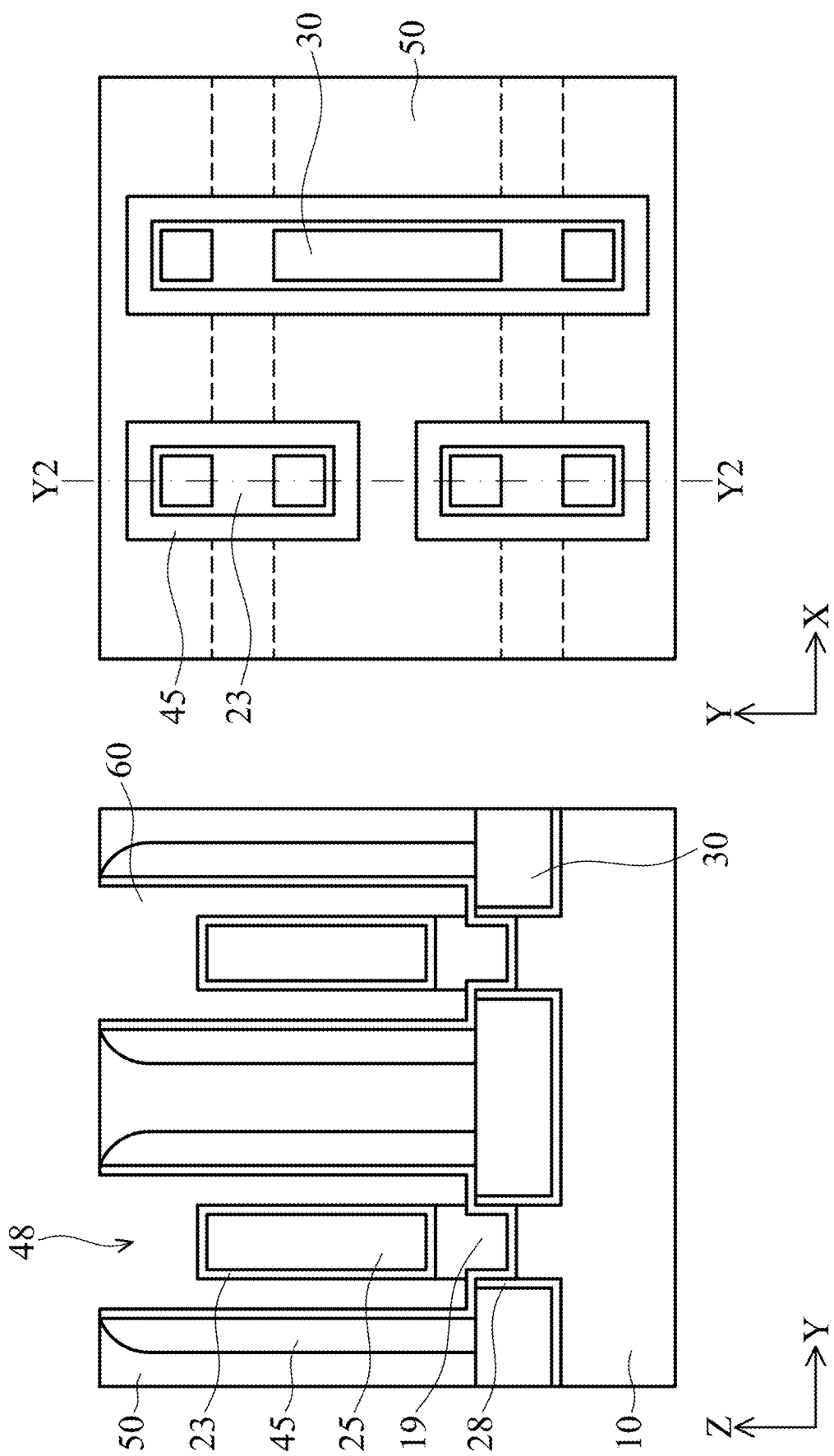

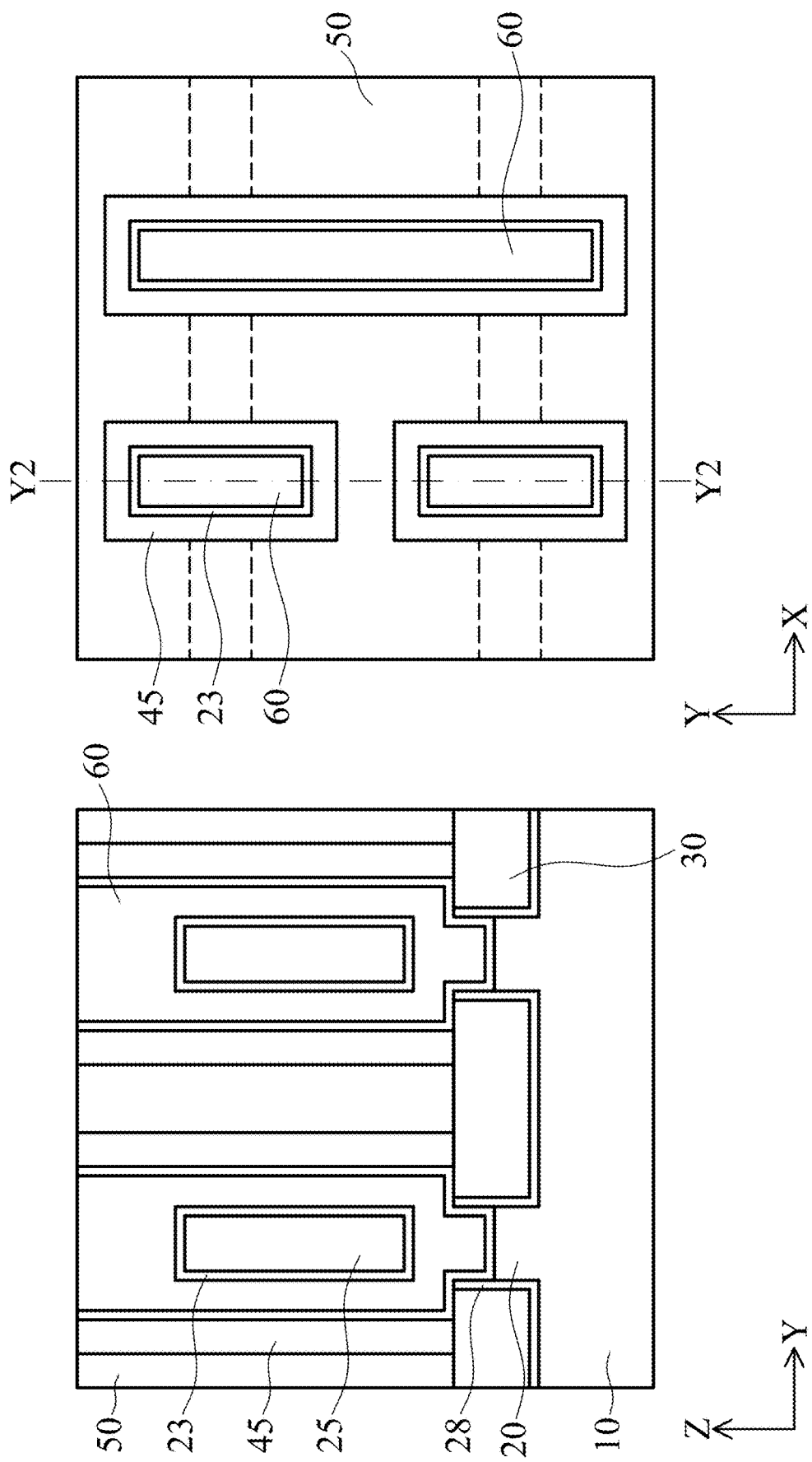

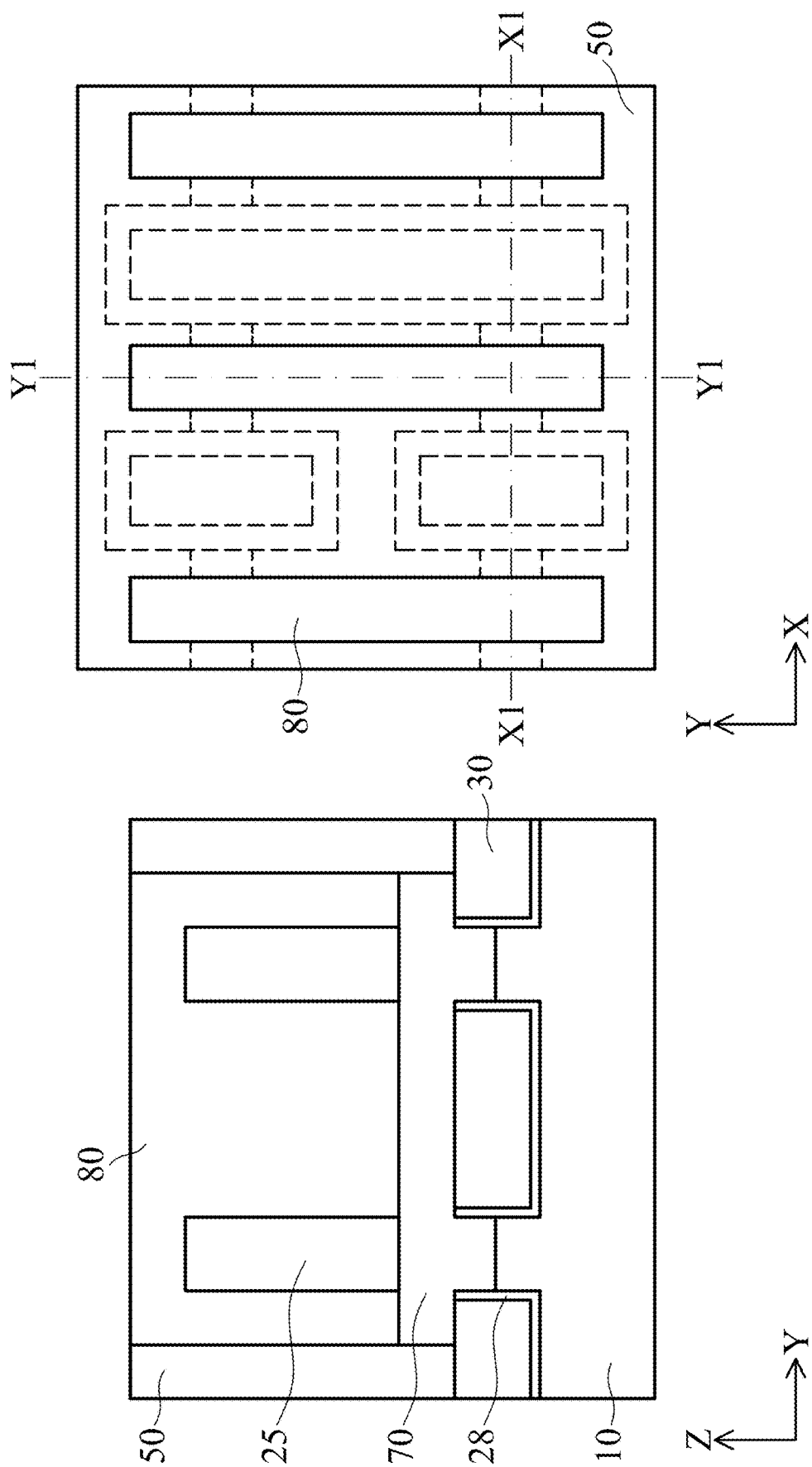

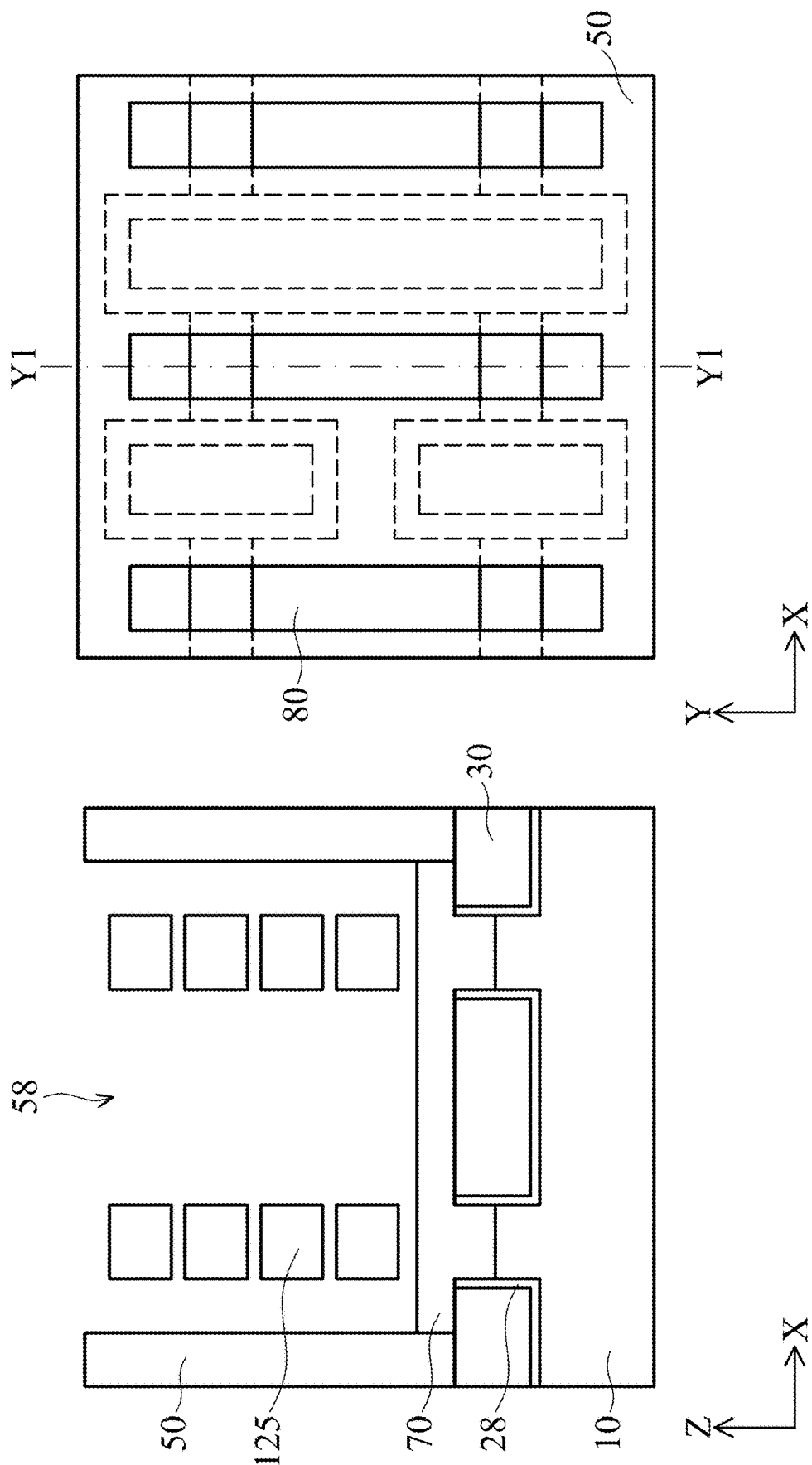

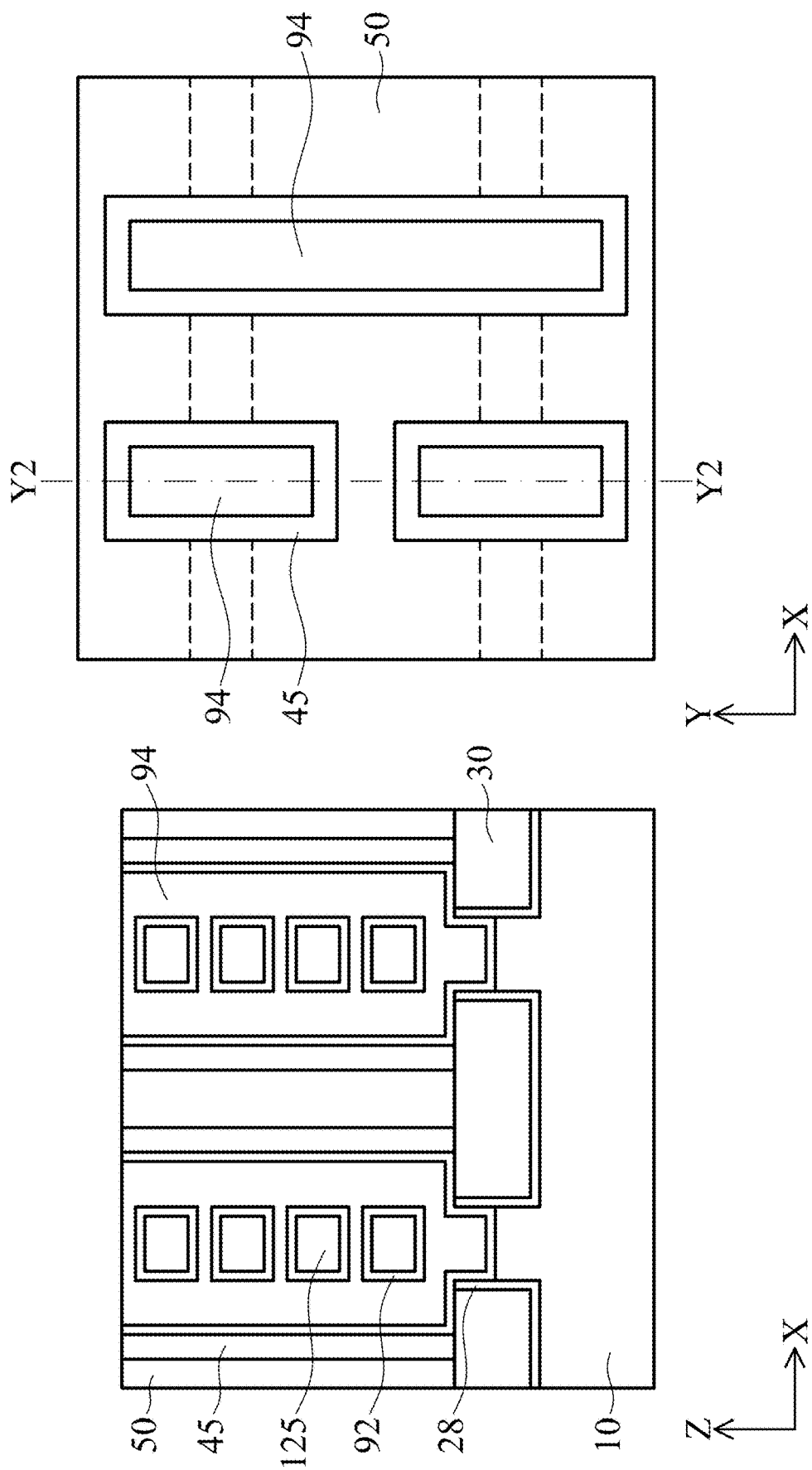

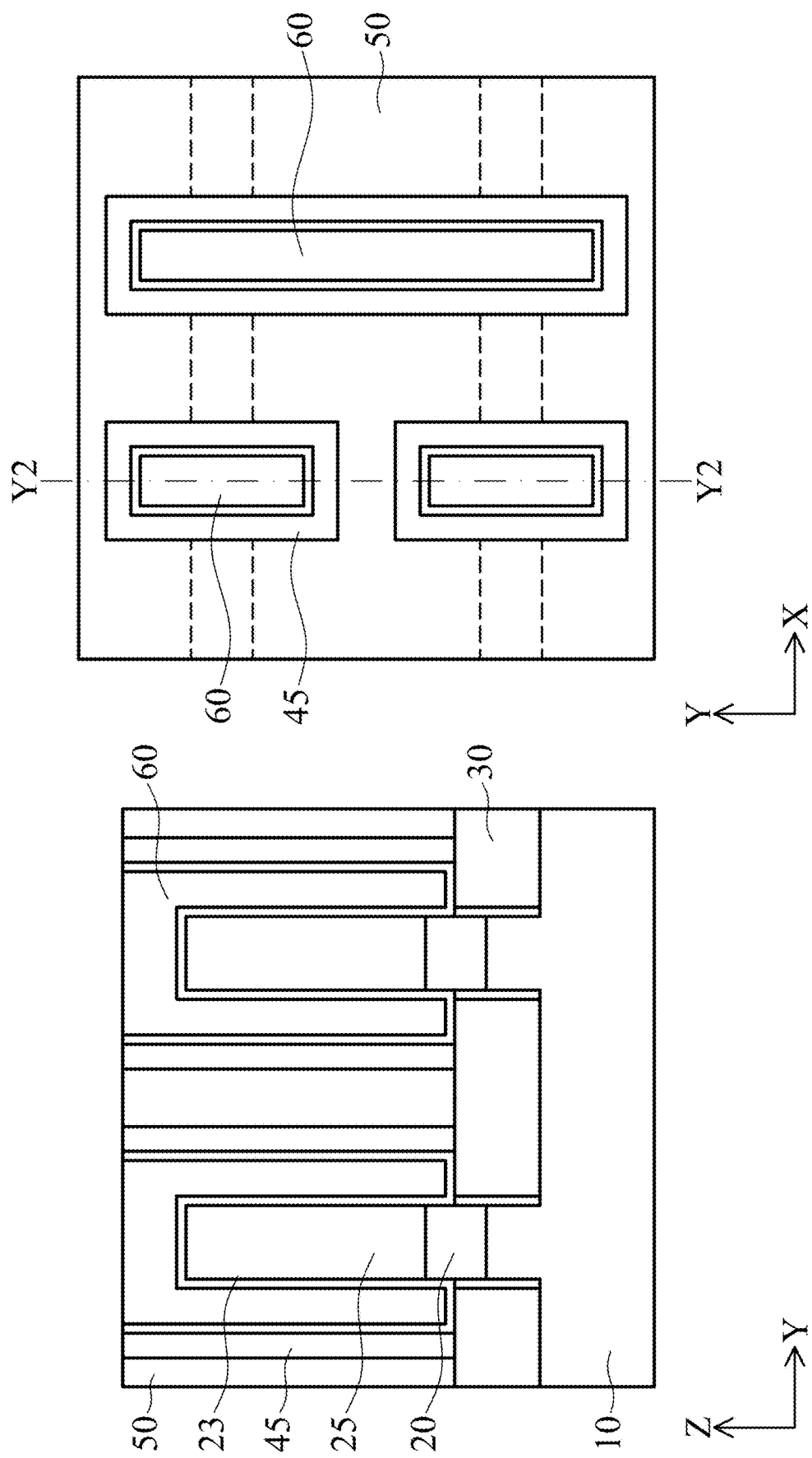

SEMICONDUCTOR DEVICE AND MANUFACTURING METHOD THEREOF

RELATED APPLICATIONS

This application is a divisional application of application Ser. No. 15/798,227 filed on Oct. 30, 2017, the entire contents of which are incorporated herein by reference.

TECHNICAL FIELD

The disclosure relates to a semiconductor integrated circuit, and more particularly to a semiconductor device having gate-all-around field effect transistors and their manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. In a GAA FET, a channel region is formed by a semiconductor wire wrapped with a gate dielectric layer and a gate electrode layer. Because the gate structure surrounds (wraps) the channel region on all lateral surfaces, the transistor essentially has four gates controlling the current through the channel region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A and 3B show one of the various stages of sequential processes for manufacturing a semiconductor device having a GAA FET according to an embodiment of the present disclosure.

FIGS. 6A and 6B show one of the various stages of sequential processes for manufacturing a semiconductor device having a GAA FET according to an embodiment of the present disclosure.

FIGS. 7A and 7B show one of the various stages of sequential processes for manufacturing a semiconductor device having a GAA FET according to an embodiment of the present disclosure.

FIGS. 8A and 8B show one of the various stages of sequential processes for manufacturing a semiconductor device having a GAA FET according to an embodiment of the present disclosure.

FIGS. 10A and 10B show one of the various stages of sequential processes for manufacturing a semiconductor device having a GAA FET according to an embodiment of the present disclosure.

FIGS. 11A and 11B show one of the various stages of sequential processes for manufacturing a semiconductor device having a GAA FET according to an embodiment of the present disclosure.

FIGS. 17A, 17B and 17C show one of the various stages of sequential processes for manufacturing a semiconductor device having a GAA FET according to an embodiment of the present disclosure.

FIGS. 20A and 20B show one of the various stages of sequential processes for manufacturing a semiconductor device having a GAA FET according to another embodiment of the present disclosure.

FIGS. 23A and 23B show a semiconductor device having a GAA FET according to another embodiment of the present disclosure.

FIGS. 24A and 24B show a semiconductor device having a FinFET according to another embodiment of the present disclosure.

DETAILED DESCRIPTION

Figure 1B:
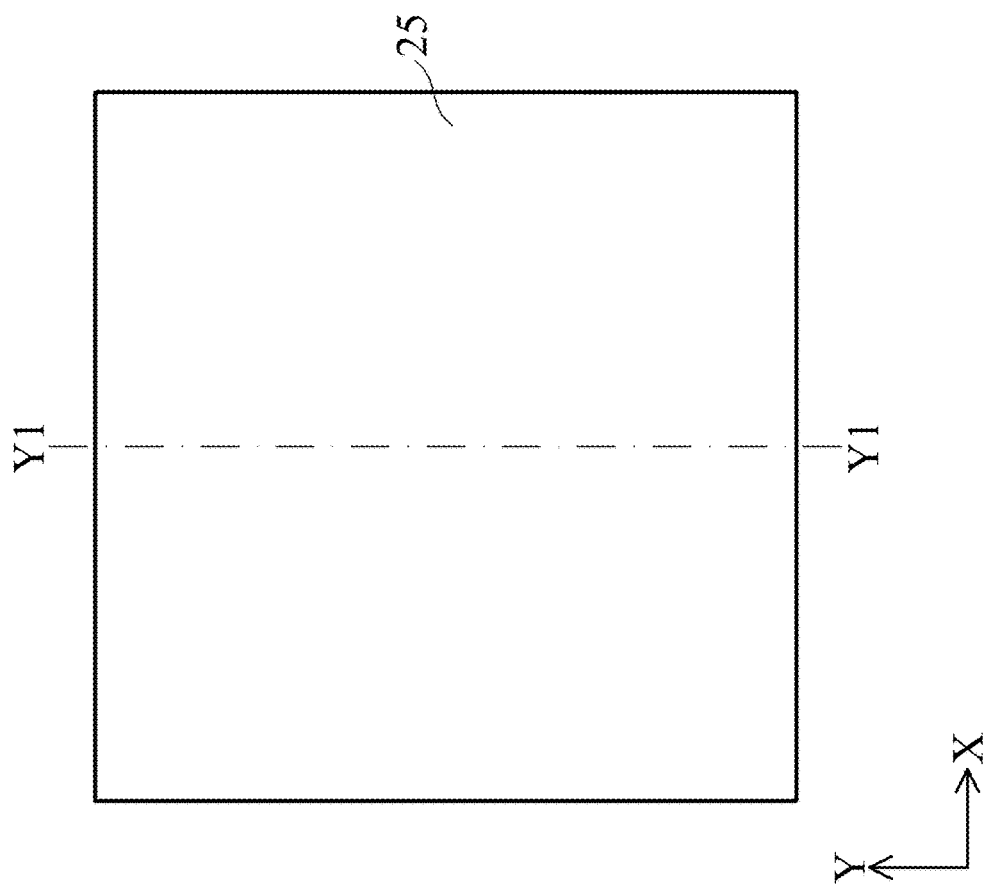
FIGS. 1A and 1B show one of the various stages of sequential processes for manufacturing a semiconductor device having a GAA FET according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

A gate-all-around FET (GAA-FET) generally includes one or more semiconductor wires having a channel region and source/drain regions disposed on both ends of the channel region. To manufacture the semiconductor wire(s), stacked layers of different semiconductor materials, one(s) of which is/are a sacrificial layer, are formed, and then the sacrificial layer(s) is/are removed, thereby leaving semiconductor wire(s). In the source/drain regions, the sacrificial layer may remain at the bottom of the stacked layers, which would cause a parasitic transistor. The parasitic transistor in a GAA FET adversely affects an off-state leakage current. In particular, when a narrow-band gap material, such as Ge, is used as a channel material, the off-state leakage current becomes more problematic.

The present disclosure provides a semiconductor device, such as a GAA FET, which can reduce the off-state leakage current.

FIGS. 1A-17B show sequential processes for manufacturing a semiconductor device having a GAA FET according to an embodiment of the present disclosure. It is understood that additional operations can be provided before, during, and after processes shown by FIGS. 1A-17B, and some of the operations described below can be replaced or eliminated, for additional embodiments of the method. The order of the operations/processes may be interchangeable. In FIGS. 1A-17B, the "B" figures (FIGS. 1B, 2B, . . . ) show plan views (viewed from above) and the "A" figures (FIGS. 1A, 2B, . . . ) show cross sectional views along the Y direction (lines Y1-Y1 or Y2-Y2).

Figure 1A:
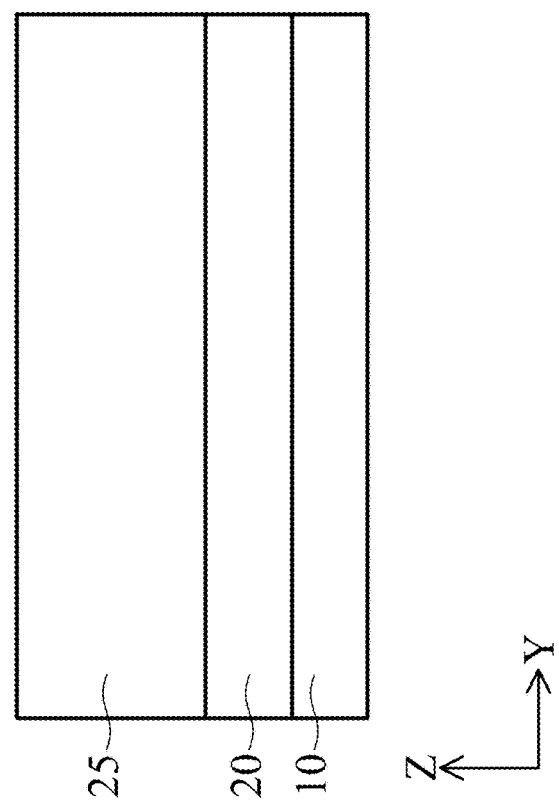

FIGS. 1A and 1B show one of the various stages of sequential processes for manufacturing a semiconductor device having a GAA FET according to an embodiment of the present disclosure. FIG. 1A is a cross sectional view corresponding to line Y1-Y1 of FIG. 1B.

As shown in FIGS. 1A and 1B, a first semiconductor layer 20 is epitaxially formed over a substrate 10, and a second semiconductor layer 25 is epitaxially formed over the first semiconductor layer 20.

In one embodiment, substrate 10 includes a single crystalline semiconductor layer on at least its surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In one embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity).

The first semiconductor layer 20, which is a sacrificial layer, includes a semiconductor material different from the substrate 10. In some embodiments, the first semiconductor layer 20 is made of epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In one embodiment, the first semiconductor layer is made of $Si_xGe_{1-x}$, where $0.1<x<0.9$ (hereinafter may be referred simply to SiGe). The thickness of the first semiconductor layer 20 is in a range from about 5 nm to about 30 nm in some embodiments, and is in a range from about 10 nm to about 20 nm in other embodiments.

The second semiconductor layer 25 includes a semiconductor material different from the first semiconductor layer 20. In some embodiments, the second semiconductor layer 25 is made of epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In one embodiment, the second semiconductor layer is made of $Si_yGe_{1-y}$, where $x<y$. In a certain embodiment, the second semiconductor layer is made of Si. The thickness of the second semiconductor layer 25 is in a range from about 10 nm to about 80 nm in some embodiments, and is in a range from about 15 nm to about 30 nm in other embodiments.

Figure 2B:
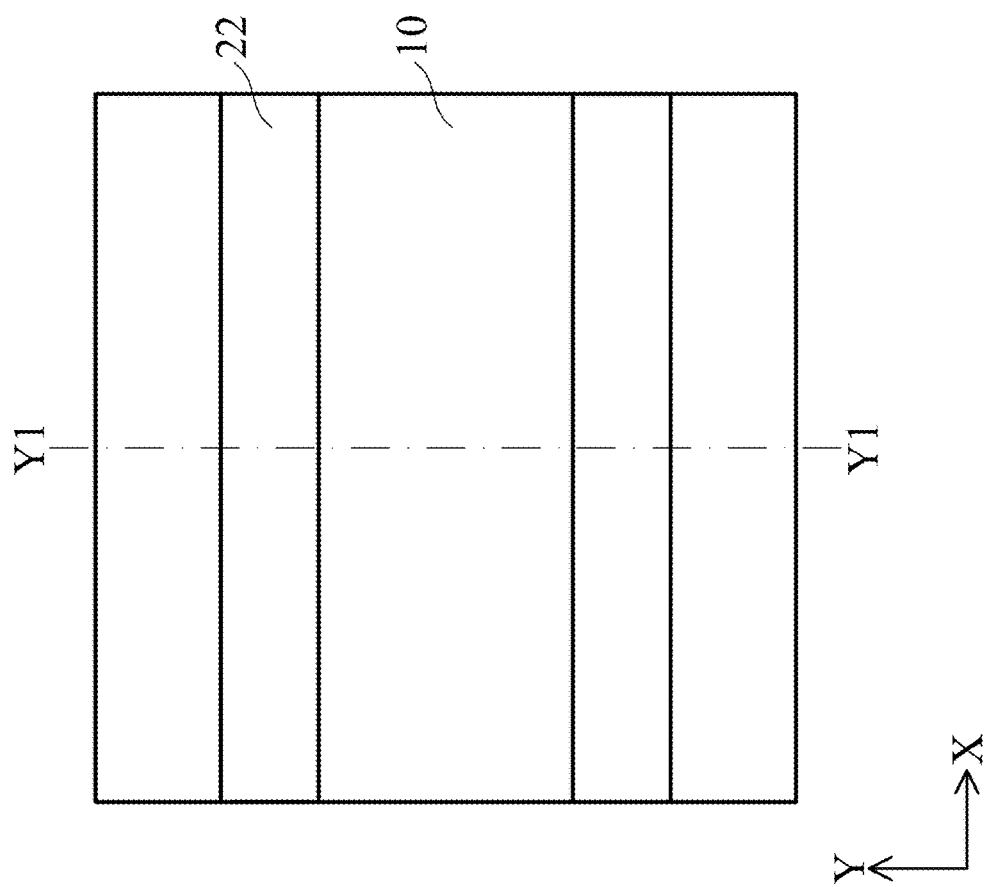
FIGS. 2A and 2B show one of the various stages of sequential processes for manufacturing a semiconductor device having a GAA FET according to an embodiment of the present disclosure.
Figure 2A:
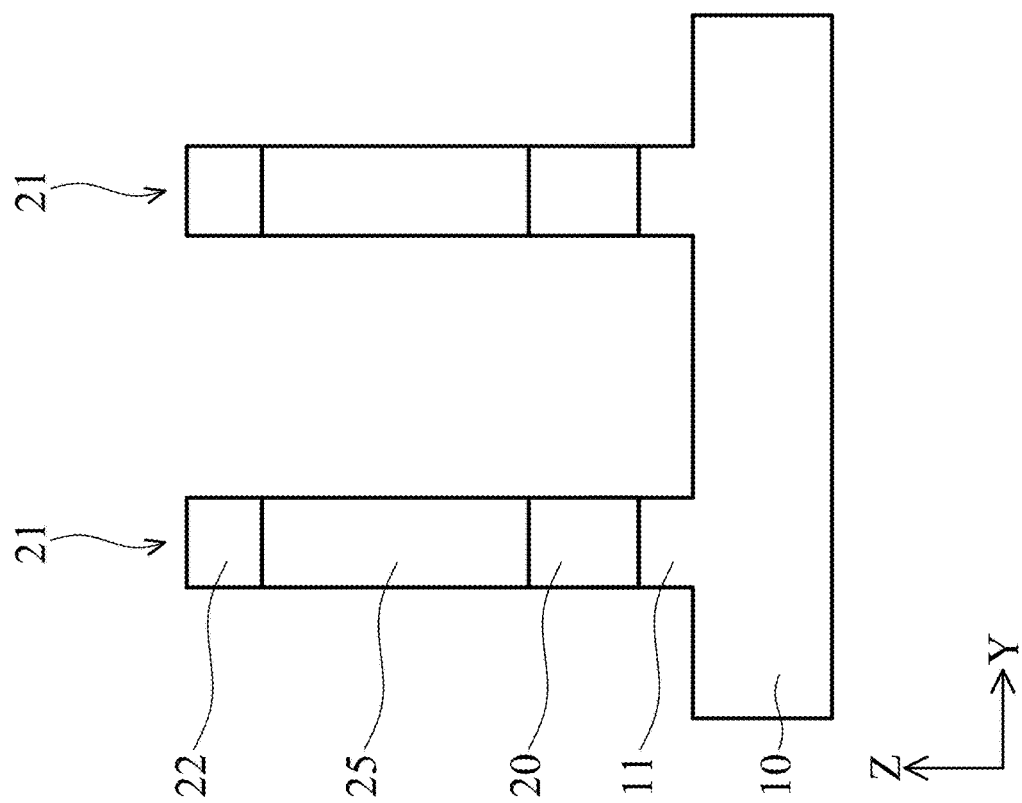

FIGS. 2A and 2B show one of the various stages of sequential processes for manufacturing a semiconductor device having a GAA FET according to an embodiment of the present disclosure. FIG. 2A is a cross sectional view corresponding to line Y1-Y1 of FIG. 2B.

Fin structures 21 are formed by one or more photolithography and etching operations, as shown in FIGS. 2A and 2B. The fin structures 21 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a dummy layer is formed over a substrate and patterned using a photolithography process. Spacers are formed alongside the patterned dummy layer using a self-aligned process. The dummy layer is then removed, and the remaining spacers may then be used to pattern the fins.

In other embodiments, the fin structures can be patterned by using a hard mask pattern 22 as an etching mask. In some embodiments, the hard mask pattern 22 includes a first mask layer and a second mask layer disposed on the first mask layer. The first mask layer is a pad oxide layer made of a silicon oxide, which can be formed by a thermal oxidation. The second mask layer is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The deposited hard mask layer is patterned into a hard mask pattern 22 by using patterning operations including photolithography and etching. Then, the second semiconductor layer 25, the first semiconductor layer 20 and the substrate 10 are patterned by using the hard mask pattern into fin structures 21, both extending in the X direction. In FIGS. 2A and 2B, two fin structures 21 are arranged in the Y direction. But the number of the fin structures is not limited to two, and may include three or more. In some embodiments, one or more dummy fin structures are formed on both sides of the fin structures to improve pattern fidelity in the patterning operations. As shown in FIG. 2A, each of the fin structures has a bottom portion 11 (a part of the substrate 10), an intermediate portion 20 (the first semiconductor layer) disposed over the bottom portion and an upper portion 25 (the second semiconductor layer) disposed over the intermediate portion.

The width of the upper portion of the fin structure along the Y direction is in a range from about 5 nm to about 40 nm in some embodiments, and is in a range from about 10 nm to about 20 nm in other embodiments. The height along the Z direction of the fin structure is in a range from about 100 nm to about 200 nm in some embodiments.

FIGS. 3A and 3B show one of the various stages of sequential processes for manufacturing a semiconductor device having a GAA FET according to an embodiment of the present disclosure. FIG. 3A is a cross sectional view corresponding to line Y1-Y1 of FIG. 3B.

After the fin structures 21 are formed, a first insulating material layer 29 including one or more layers of insulating material is formed over the substrate 10 so that the fin structures 21 are fully embedded in the first insulating material layer 29. The insulating material for the first insulating material layer 29 may include silicon oxide, silicon nitride, silicon oxynitride (SiON), SiCN, fluorine-doped silicate glass (FSG), or a low-K dielectric material, formed by LPCVD (low pressure chemical vapor deposition), plasma-CVD or flowable CVD or any other suitable film formation methods. In some embodiments, the first insulating material layer 29 is made of silicon oxide. An anneal operation may be performed after the formation of the first insulating material layer 29. Then, a planarization operation, such as a chemical mechanical polishing (CMP) method and/or an etch-back method, is performed such that the hard mask patterns 22 are removed and upper surfaces of the second semiconductor layer 25 are exposed from the first insulating material layer 29 as shown in FIG. 3A.

In some embodiments, one or more fin liner layers 28 are formed over the fin structures before forming the first insulating material layer 29. The fin liner layer 28 may be made of SiN or a silicon nitride-based material (e.g., SiON or SiCN).

Figures 4A, 4B:
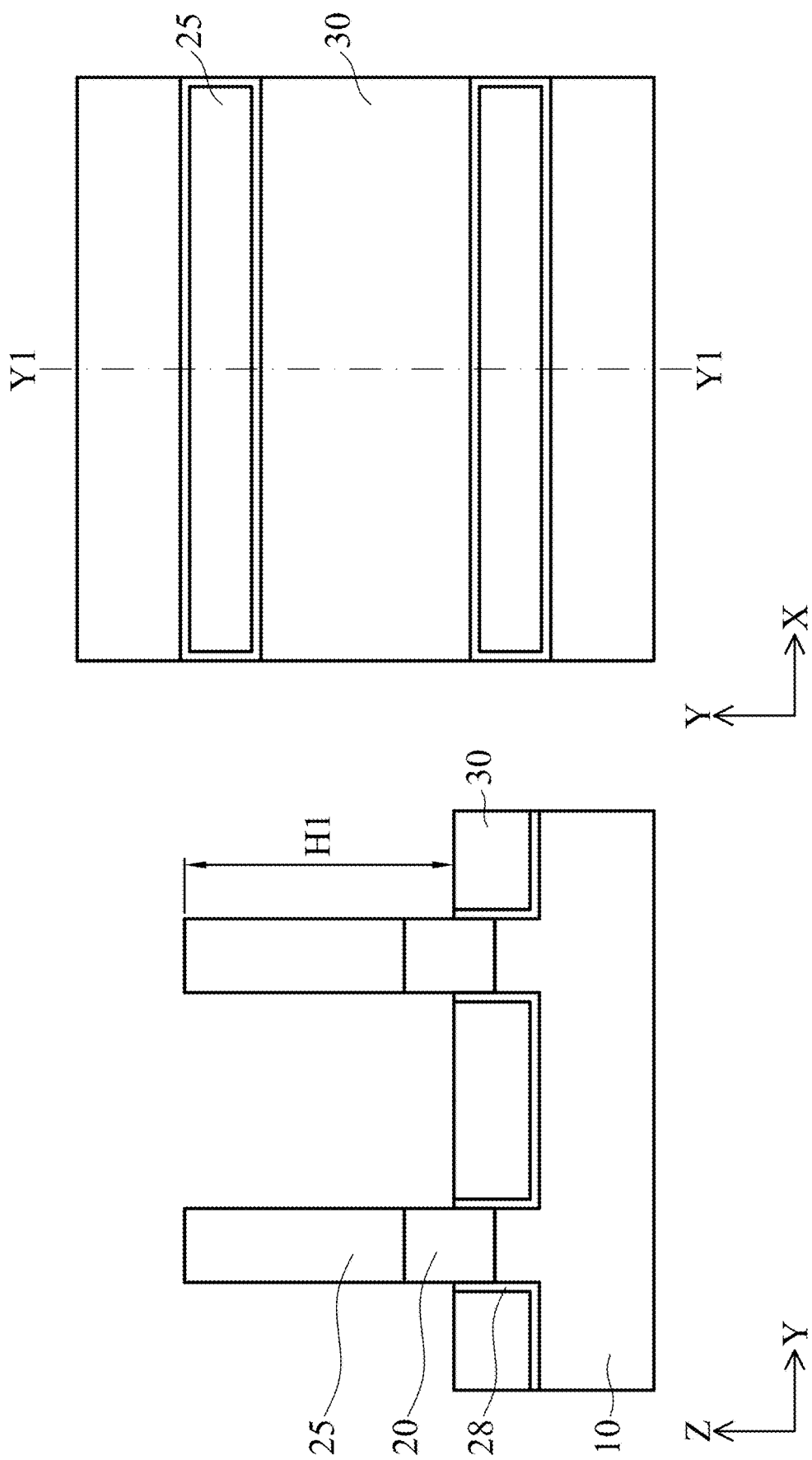
FIGS. 4A and 4B show one of the various stages of sequential processes for manufacturing a semiconductor device having a GAA FET according to an embodiment of the present disclosure.

FIGS. 4A and 4B show one of the various stages of sequential processes for manufacturing a semiconductor device having a GAA FET according to an embodiment of the present disclosure. FIG. 4A is a cross sectional view corresponding to line Y1-Y1 of FIG. 4B.

Then, as shown in FIG. 4A, the first insulating material layer 29 is recessed to form a first isolation insulating layer 30 so that the upper portions of the fin structures 21 are exposed. With this operation, the fin structures 21 are electrically separated from each other by the first isolation insulating layer 30, which is also called a shallow trench isolation (STI). After the recess etching, the height $H_1$ of the exposed fin structures is in a range from about 40 nm to about 100 nm in some embodiments, and is in a range from about 60 nm to about 80 nm in other embodiments.

As shown in FIG. 4A, a part of the first semiconductor layer 20 is exposed from the first isolation insulating layer 30. In other embodiments, the first semiconductor layer 20 is fully exposed from the isolation insulating layer 30.

Figure 5B:
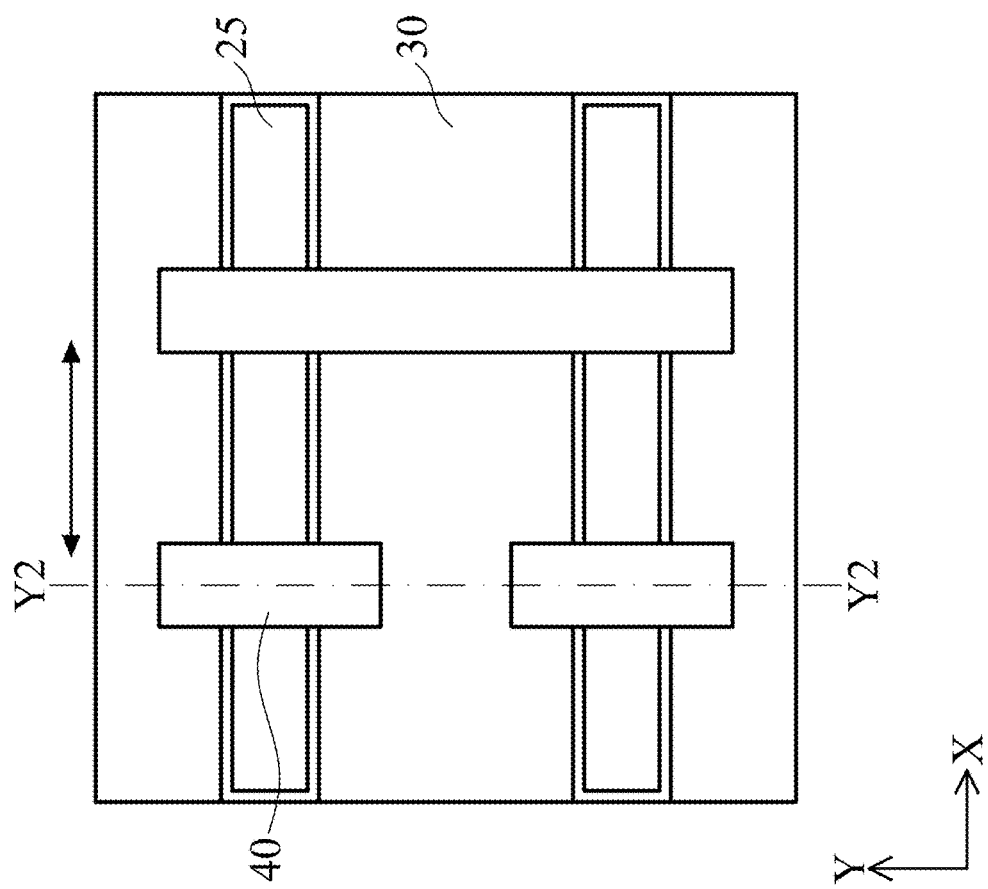
FIGS. 5A and 5B show one of the various stages of sequential processes for manufacturing a semiconductor device having a GAA FET according to an embodiment of the present disclosure.
Figure 5A:
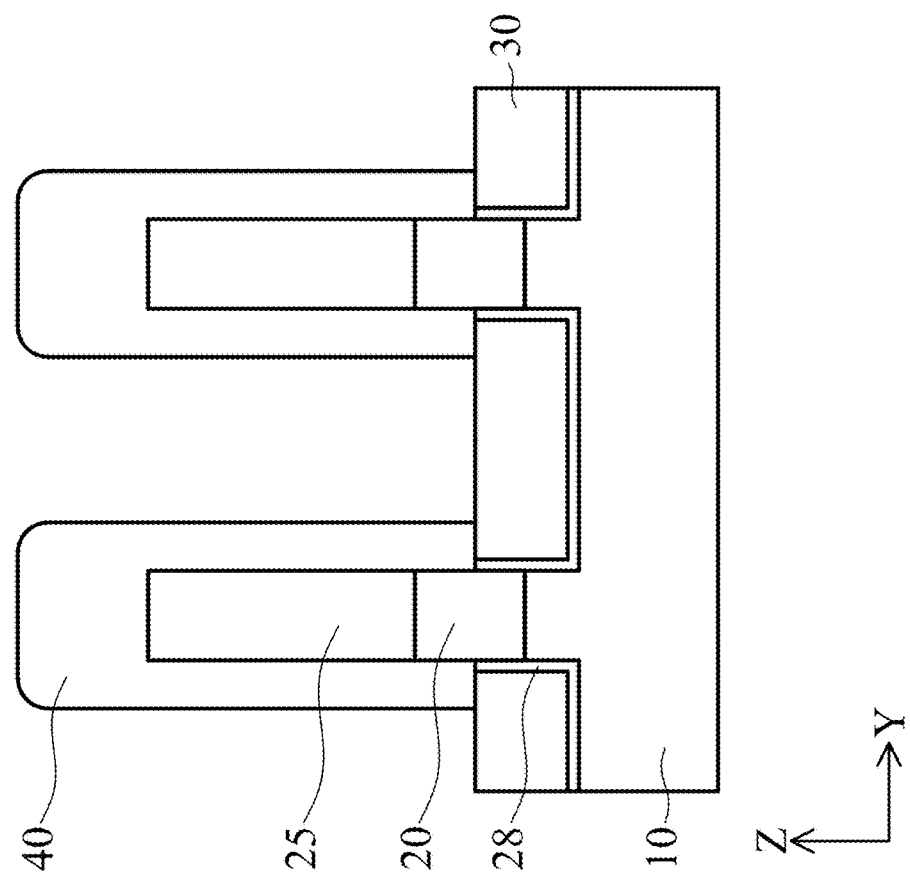

FIGS. 5A and 5B show one of the various stages of sequential processes for manufacturing a semiconductor device having a GAA FET according to an embodiment of the present disclosure. FIG. 5A is a cross sectional view corresponding to line Y2-Y2 of FIG. 5B.

After the first isolation insulating layer 30 is formed, a dummy gate structure 40 is formed, as shown in FIGS. 5A and 5B. The dummy gate structure 40 includes a dummy gate dielectric layer and a dummy gate electrode layer. The dummy gate dielectric layer includes one or more layers of insulating material, such as a silicon oxide-based material. In one embodiment, silicon oxide formed by CVD is used. The thickness of the dummy gate dielectric layer is in a range from about 1 nm to about 5 nm in some embodiments.

The dummy gate structure 40 is formed by first blanket depositing the dummy gate dielectric layer over the exposed fin structures 21 and the upper surface of the first isolation insulating layer 30. A dummy gate electrode layer is then blanket deposited on the dummy gate dielectric layer, such that the fin structures are fully embedded in the dummy gate electrode layer. The dummy gate electrode layer includes silicon such as polycrystalline silicon (polysilicon) or amorphous silicon. In some embodiments, the dummy gate electrode layer is made of polysilicon. The thickness of the dummy gate electrode layer is in a range from about 100 nm to about 300 nm in some embodiments. In some embodiments, the dummy gate electrode layer is subjected to a planarization operation. The dummy gate dielectric layer and the dummy gate electrode layer are deposited using CVD, including LPCVD and PECVD, PVD, ALD, or other suitable process. Subsequently, a mask layer is formed over the dummy gate electrode layer. The mask layer can be a resist pattern or a hard mask pattern.

Next, a patterning operation is performed on the mask layer and dummy gate electrode layer is patterned to form the dummy gate structures 40, as shown in FIGS. 5A and 5B.

By patterning the dummy gate structures, the upper portions of the fin structures 21, which are to be source/drain regions, are partially exposed on opposite sides of the dummy gate structures, as shown in FIG. 5B. In this disclosure, a source and a drain are interchangeably used and the structures thereof are substantially the same. In FIG. 5B, two dummy gate structures 40 are formed on two fin structures 21, respectively, and one dummy gate structure 40 is formed over two fin structures 21. However, the layout is not limited to FIG. 5B.

The width of the dummy gate structures 40 in the X direction is in a range from about 5 nm to about 30 nm in some embodiments, and is in a range from about 7 nm to about 15 nm in other embodiments. A pitch of the dummy gate structures is in a range from about 10 nm to about 50 nm in some embodiments, and is in a range from about 15 nm to about 40 nm in other embodiments.

FIGS. 6A and 6B show one of the various stages of sequential processes for manufacturing a semiconductor device having a GAA FET according to an embodiment of the present disclosure. FIG. 6A is a cross sectional view corresponding to line Y2-Y2 of FIG. 6B.

After the dummy gate structures 40 are formed, a blanket layer of an insulating material for sidewall spacers 45 is conformally formed by using CVD or other suitable methods. The blanket layer is deposited in a conformal manner so that it is formed to have substantially equal thicknesses on vertical surfaces, such as the sidewalls, horizontal surfaces, and the top of the dummy gate structures. In some embodiments, the blanket layer is deposited to a thickness in a range from about 2 nm to about 20 nm. In one embodiment, the insulating material of the blanket layer is different from the materials of the first isolation insulating layer and the second isolation insulating layer, and is made of a silicon nitride-based material, such as SiN, SiON, SiOCN or SiCN and combinations thereof. In some embodiments, the blanket layer (sidewall spacers 45) is made of SiN. The sidewall spacers 45 are formed on opposite sidewalls of the dummy gate structures 40, by anisotropic etching, as shown in FIGS. 6A and 6B.

FIGS. 7A and 7B show one of the various stages of sequential processes for manufacturing a semiconductor device having a GAA FET according to an embodiment of the present disclosure. FIG. 7A is a cross sectional view corresponding to line Y2-Y2 of FIG. 7B.

After the sidewall spacers 45 are formed, an interlayer dielectric (ILD) layer 50 is formed, as shown in FIGS. 7A and 7B. The materials for the ILD layer 50 include compounds comprising Si, O, C and/or H, such as silicon oxide, SiCOH and SiOC. Organic materials, such as polymers, may be used for the ILD layer 50. After the ILD layer 50 is formed, a planarization operation, such as CMP, is performed, so that the top portions of the dummy gate electrode layers of the dummy gate structures 40 are exposed.

FIGS. 8A and 8B show one of the various stages of sequential processes for manufacturing a semiconductor device having a GAA FET according to an embodiment of the present disclosure. FIG. 8A is a cross sectional view corresponding to line Y2-Y2 of FIG. 8B.

Next, as shown in FIGS. 8A and 8B, the dummy gate structures 40 are removed, thereby forming gate spaces 48, in which the upper portions of the fin structures 21 (the second semiconductor layer 25 and at least a part of the first semiconductor layer 20) are exposed, respectively. The sidewall spacers 45 are not removed.

The dummy gate structures can be removed using plasma dry etching and/or wet etching. When the dummy gate electrode layer is polysilicon and the ILD layer 50 is silicon oxide, a wet etchant such as a TMAH solution can be used to selectively remove the dummy gate electrode layer. The dummy gate dielectric layer is thereafter removed using plasma dry etching and/or wet etching.

Figure 9B:
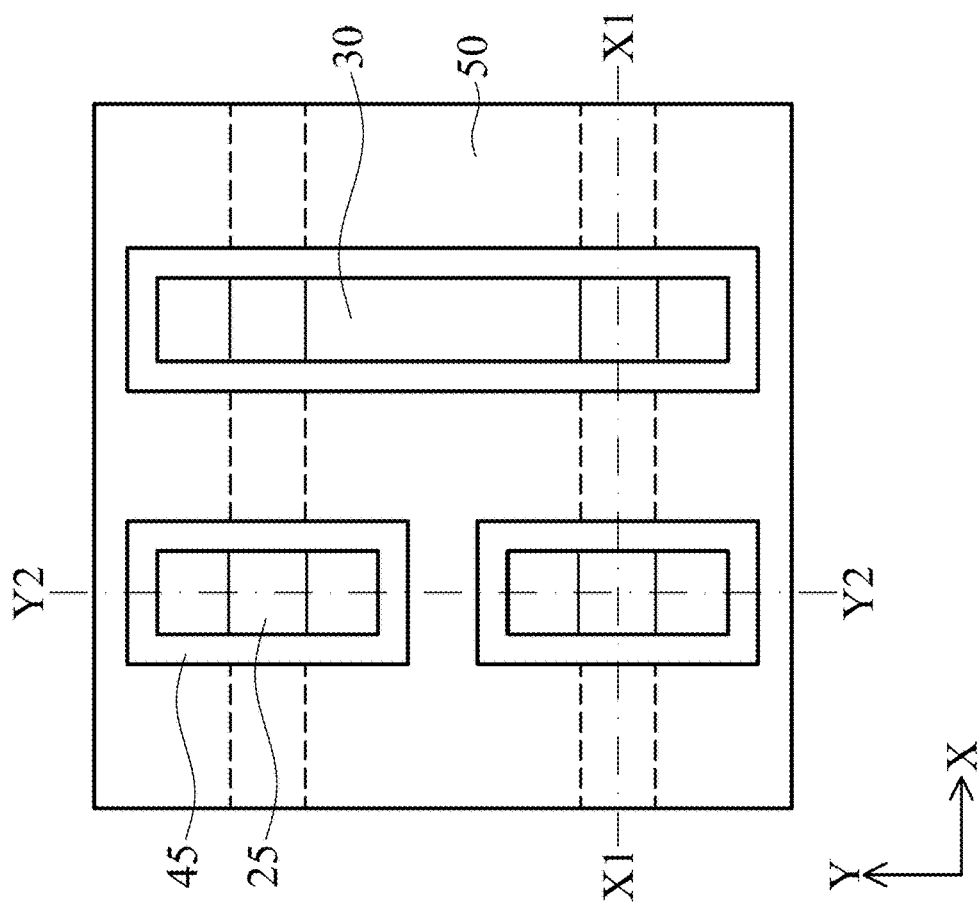
FIGS. 9A, 9B and 9C show one of the various stages of sequential processes for manufacturing a semiconductor device having a GAA FET according to an embodiment of the present disclosure.
Figure 9A:
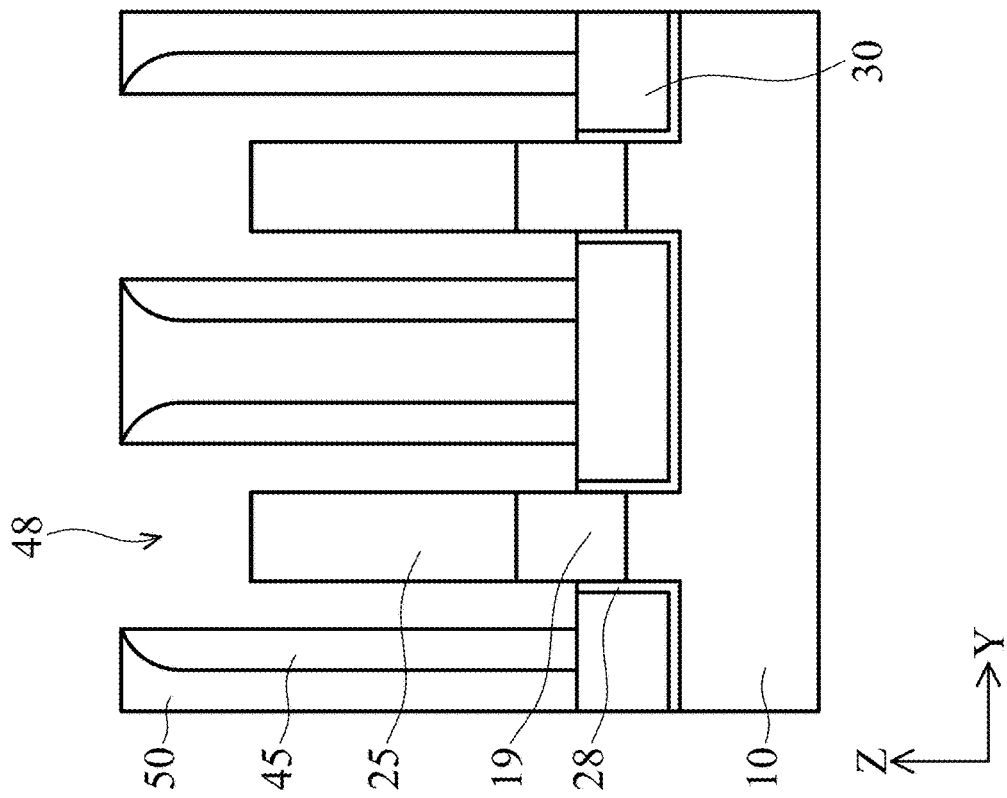
Figure 9C:
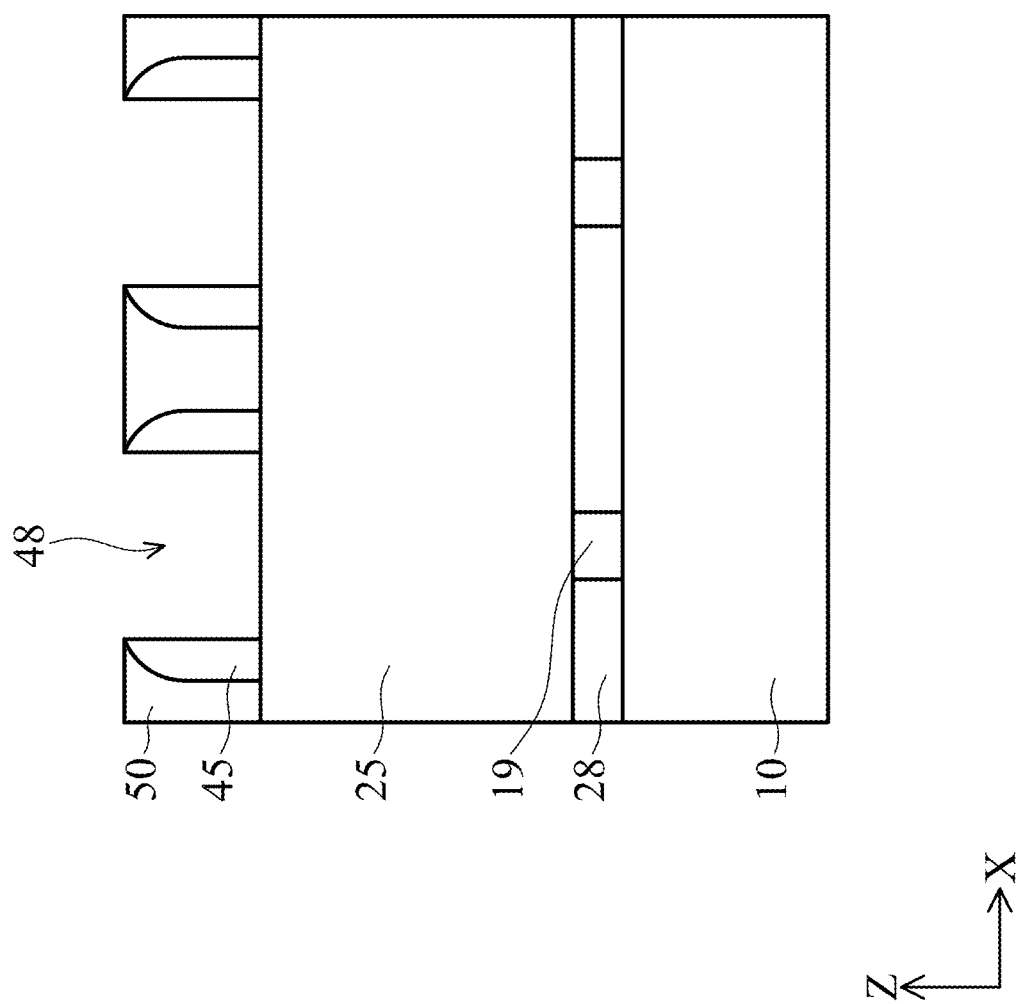

FIGS. 9A-9C show one of the various stages of sequential processes for manufacturing a semiconductor device having a GAA FET according to an embodiment of the present disclosure. FIG. 9A is a cross sectional view corresponding to line Y2-Y2 of FIG. 9B, and FIG. 9C is a cross sectional view corresponding to line X1-X1 of FIG. 9B.

In the gate spaces 48, the first semiconductor layer 20 is removed, thereby forming a space 19, as shown in FIG. 9A. When the first semiconductor layers 20 are Ge or SiGe and the second semiconductor layers 25 and the substrate 10 are Si, the first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. By removing the first semiconductor layer 20 in the gate space 48, a semiconductor wire structure having a channel region is formed. Depending on the aspect ratio of the second semiconductor layer 25, the semiconductor wire structure can also be referred to as a semiconductor fin structure.

FIGS. 10A and 10B show one of the various stages of sequential processes for manufacturing a semiconductor device having a GAA FET according to an embodiment of the present disclosure. FIG. 10A is a cross sectional view corresponding to line Y2-Y2 of FIG. 10B.

After the channel layer is formed, a gate dielectric layer 23 is formed over the channel region (second semiconductor layer 25) and the surrounding areas, as shown in FIGS. 10A and 10B. In certain embodiments, the gate dielectric layer 23 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 23 includes an interfacial layer formed between the channel layers and the dielectric material.

The gate dielectric layer 23 may be formed by CVD, ALD or any suitable method. In one embodiment, the gate dielectric layer 23 is formed using a highly conformal deposition process such as ALD in order to ensure the formation of a gate dielectric layer having a uniform thickness around each channel layer. The thickness of the gate dielectric layer 23 is in a range from about 1 nm to about 6 nm in one embodiment.

Figure 12B:
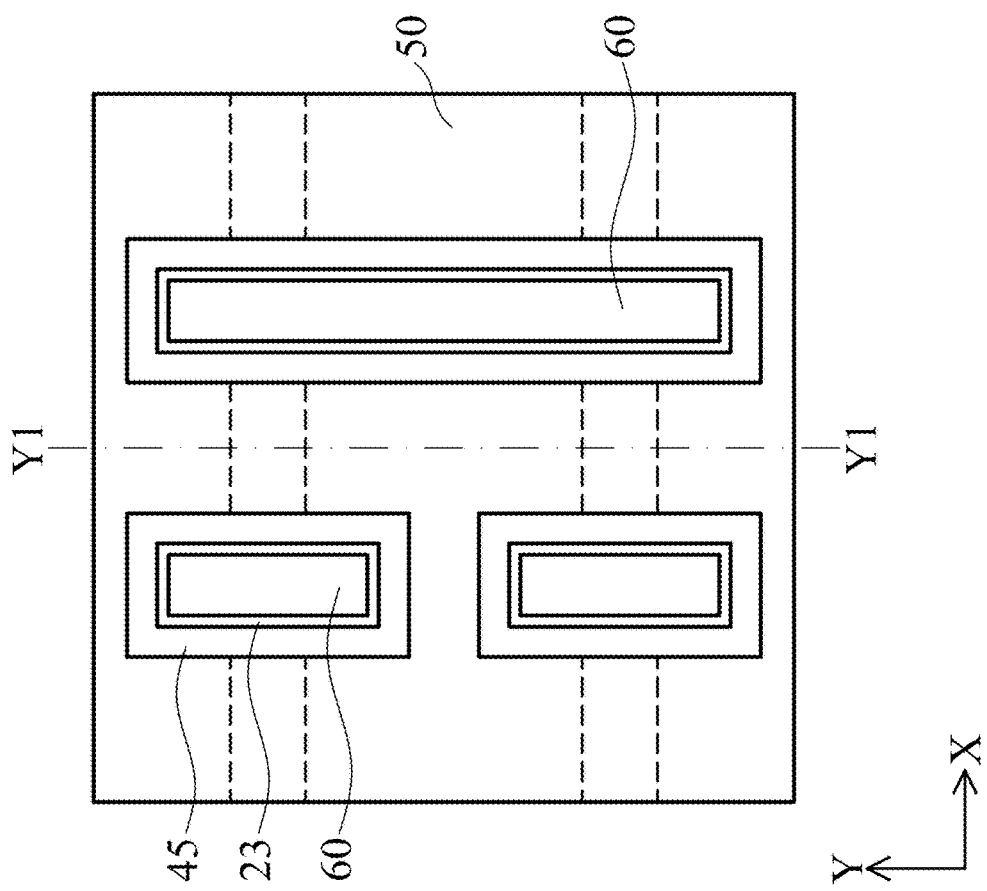
FIGS. 12A and 12B show one of the various stages of sequential processes for manufacturing a semiconductor device having a GAA FET according to an embodiment of the present disclosure.

FIGS. 11A-12B show one of the various stages of sequential processes for manufacturing a semiconductor device having a GAA FET according to an embodiment of the present disclosure. FIG. 11B and FIG. 12B are the same. FIG. 11A is a cross sectional view corresponding to line Y2-Y2 of FIG. 11B, and FIG. 12A is a cross sectional view corresponding to line Y1-Y1 of FIG. 12B.

Subsequently, a gate electrode layer 60 is formed on the gate dielectric layer 23. The gate electrode layer 60 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 60 may be formed by CVD, ALD, electro-plating, or other suitable method. The gate dielectric layer and the electrode layer are also deposited over the upper surface of the ILD layer 50. The gate dielectric layer and the gate electrode layer formed over the ILD layer 50 are then planarized by using, for example, CMP, until the top surface of the ILD layer 50 is revealed, as shown in FIG. 11A.

In certain embodiments of the present disclosure, one or more work function adjustment layers (not shown) are interposed between the gate dielectric layer 23 and the gate electrode layer 60. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 12A:
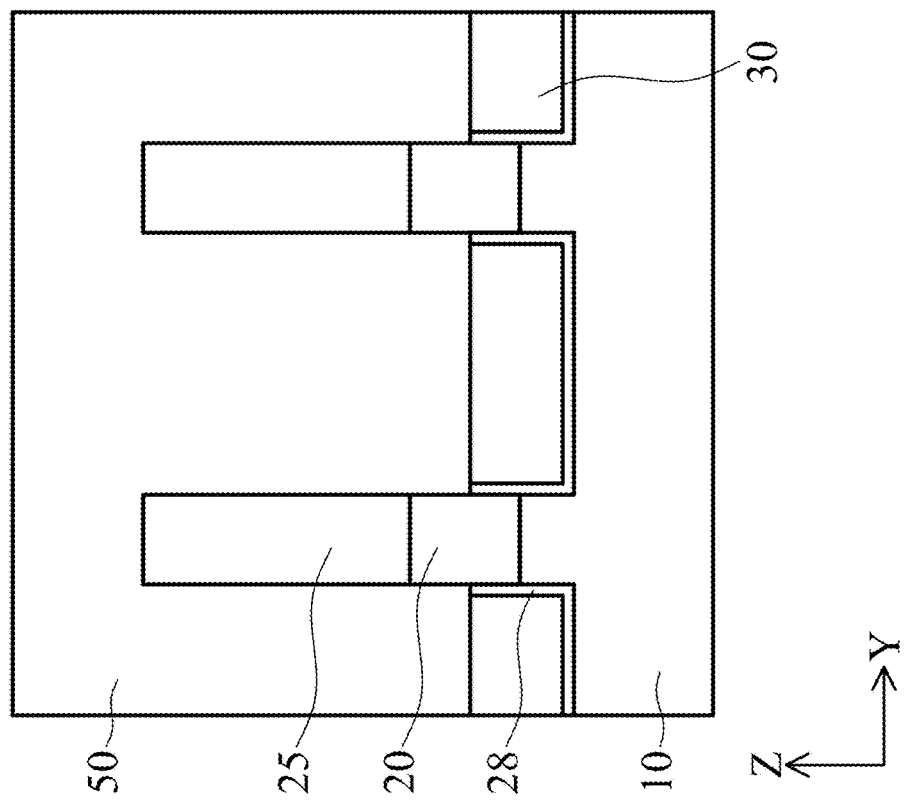

FIG. 12A shows the source/drain regions after the gate electrode layer 60 is formed. As shown in FIG. 12A, the first semiconductor layers 20 remain in the fin structure.

Figure 13B:
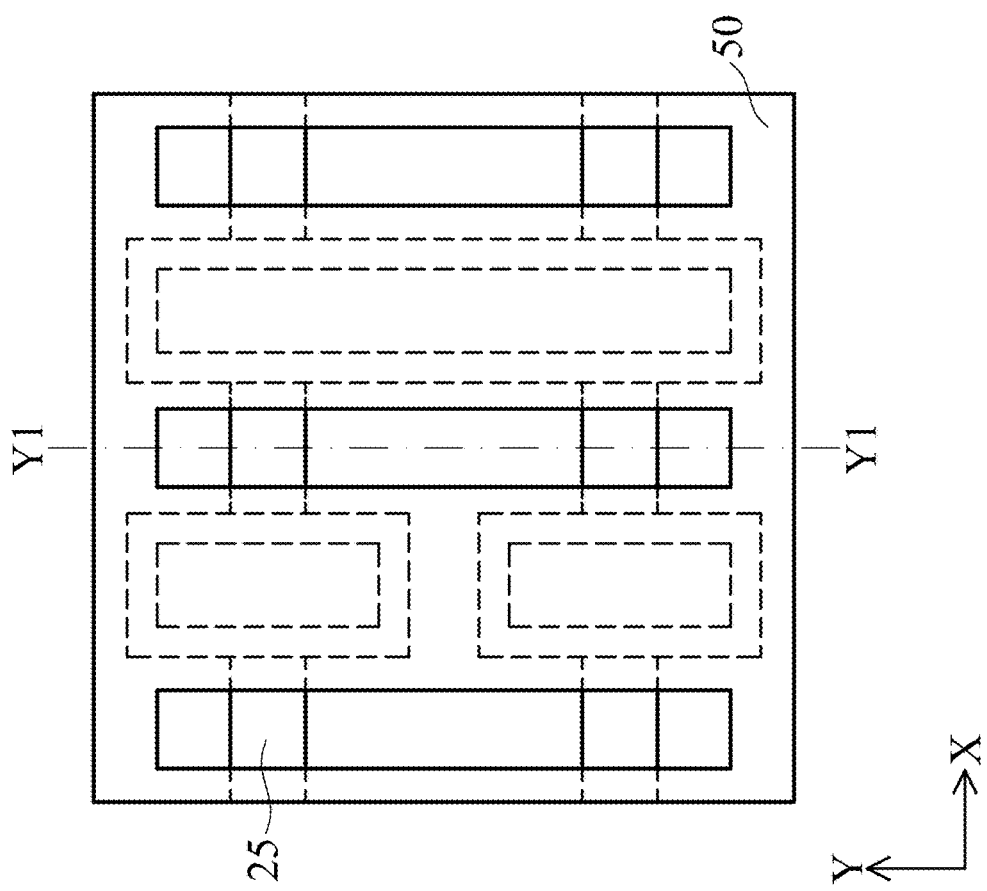
FIGS. 13A and 13B show one of the various stages of sequential processes for manufacturing a semiconductor device having a GAA FET according to an embodiment of the present disclosure.
Figure 13A:
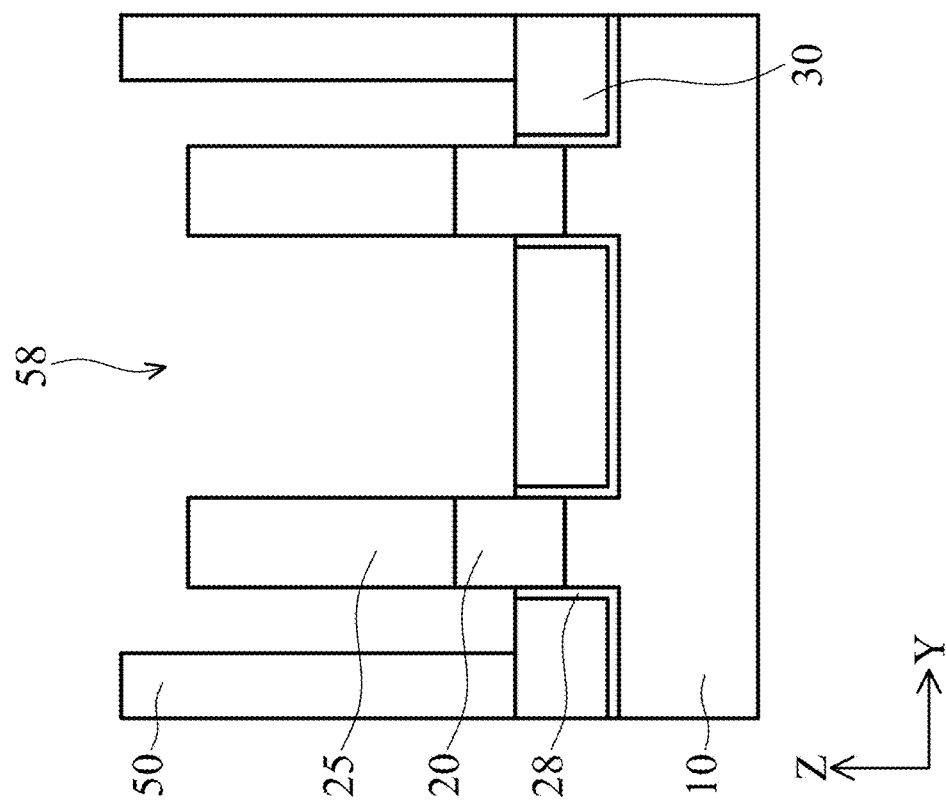

FIGS. 13A and 13B show one of the various stages of sequential processes for manufacturing a semiconductor device having a GAA FET according to an embodiment of the present disclosure. FIG. 13A is a cross sectional view corresponding to line Y1-Y1 of FIG. 13B.

As shown in FIGS. 13A and 13B, the ILD layer 50 is patterned by one or more lithography and etching operations, thereby forming a first source/drain opening 58. In the first source/drain opening 58, the second semiconductor layer 25 and at least a part of the first semiconductor layer 20 are exposed.

In some embodiments, the second semiconductor layer 25, which becomes a source/drain region, is doped with appropriate dopants before or after the first source/drain opening 58 is formed. In other embodiments, one or more epitaxial layers are formed over the second semiconductor layer 25 before or after the first source/drain opening 58 is formed.

In FIGS. 13A and 13B, one source/drain opening 58 is formed to expose two fin structures. However, the configuration is not limited to this. In some embodiments, one source/drain opening 58 is formed over one fin structure, and in other embodiments, one source/drain opening 58 is formed over three or more fin structures.

Figure 14B:
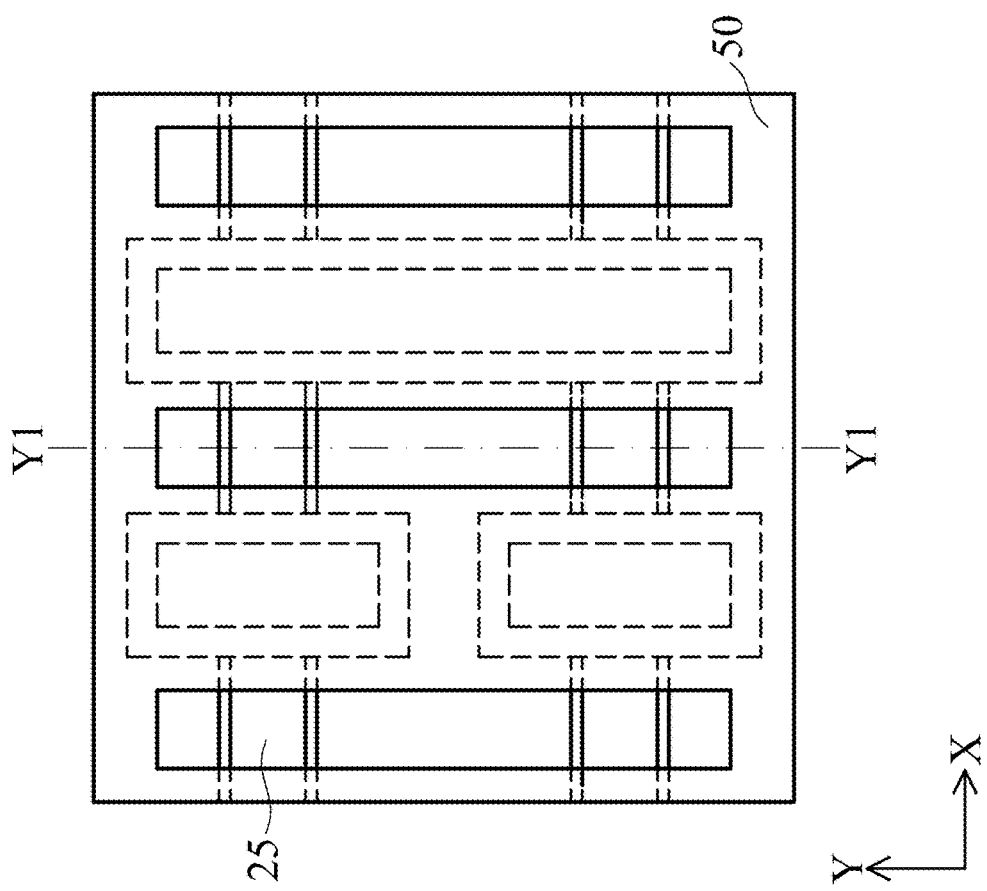
FIGS. 14A and 14B show one of the various stages of sequential processes for manufacturing a semiconductor device having a GAA FET according to an embodiment of the present disclosure.
Figure 14A:
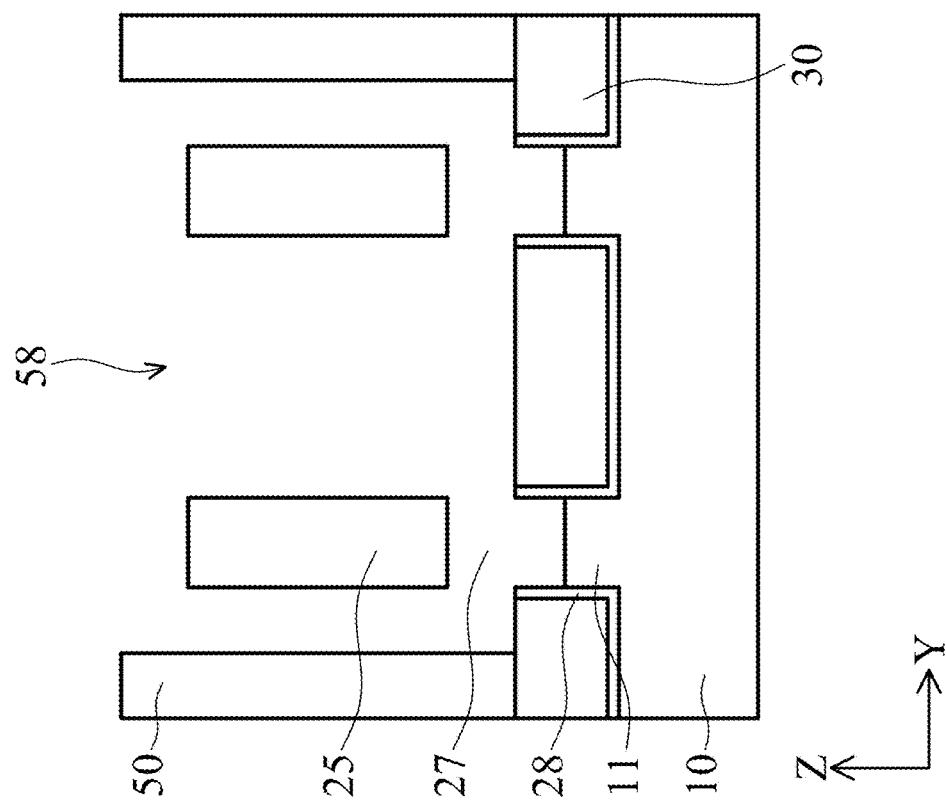

FIGS. 14A and 14B show one of the various stages of sequential processes for manufacturing a semiconductor device having a GAA FET according to an embodiment of the present disclosure. FIG. 14A is a cross sectional view corresponding to line Y1-Y1 of FIG. 14B.

In the first source/drain openings 58, the first semiconductor layer 20 is removed, thereby forming a space 27, as shown in FIG. 14A. When the first semiconductor layers 20 are Ge or SiGe and the second semiconductor layers 25 and the substrate 10 are Si, the first semiconductor layers 20 can be selectively removed using a wet etchant such as, but not limited to, ammonium hydroxide ($NH_4OH$), tetramethylammonium hydroxide (TMAH), ethylenediamine pyrocatechol (EDP), or potassium hydroxide (KOH) solution. By removing the first semiconductor layer 20 in the first source/drain opening 58, a source/drain region is separated from the substrate 10 (the bottom portion of the fin structure protruding from the substrate 10).

Figure 15B:
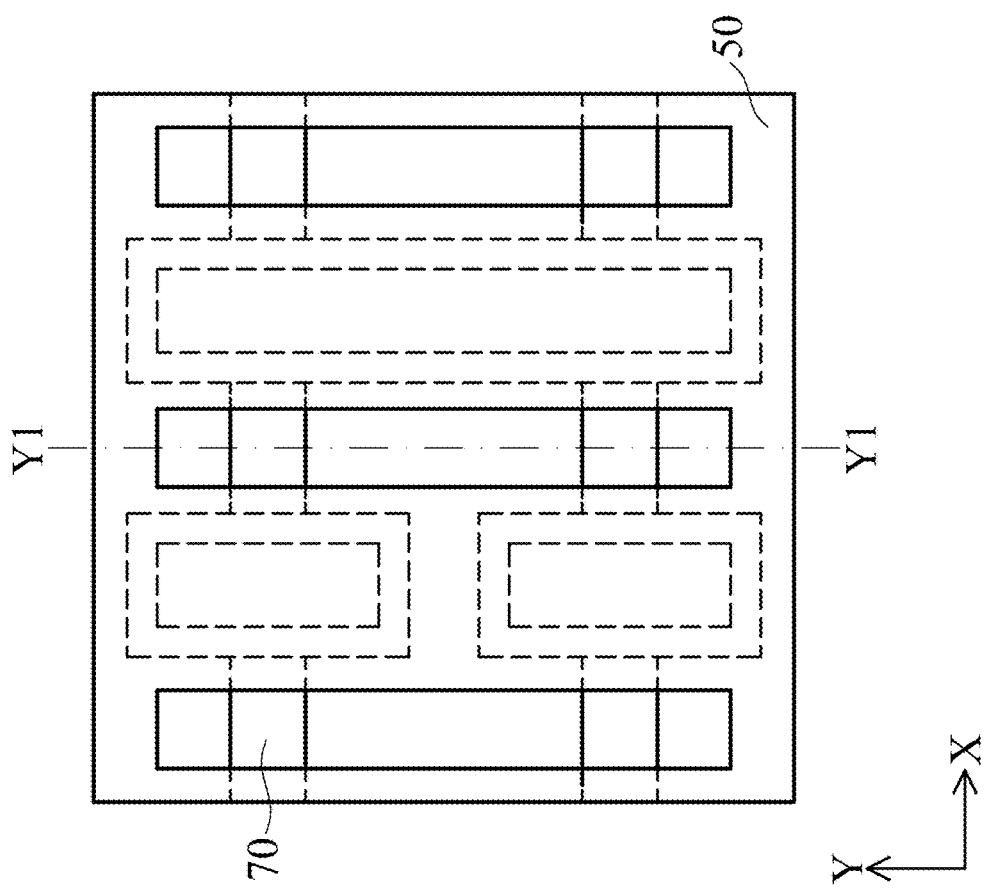
FIGS. 15A and 15B show one of the various stages of sequential processes for manufacturing a semiconductor device having a GAA FET according to an embodiment of the present disclosure.
Figure 15A:
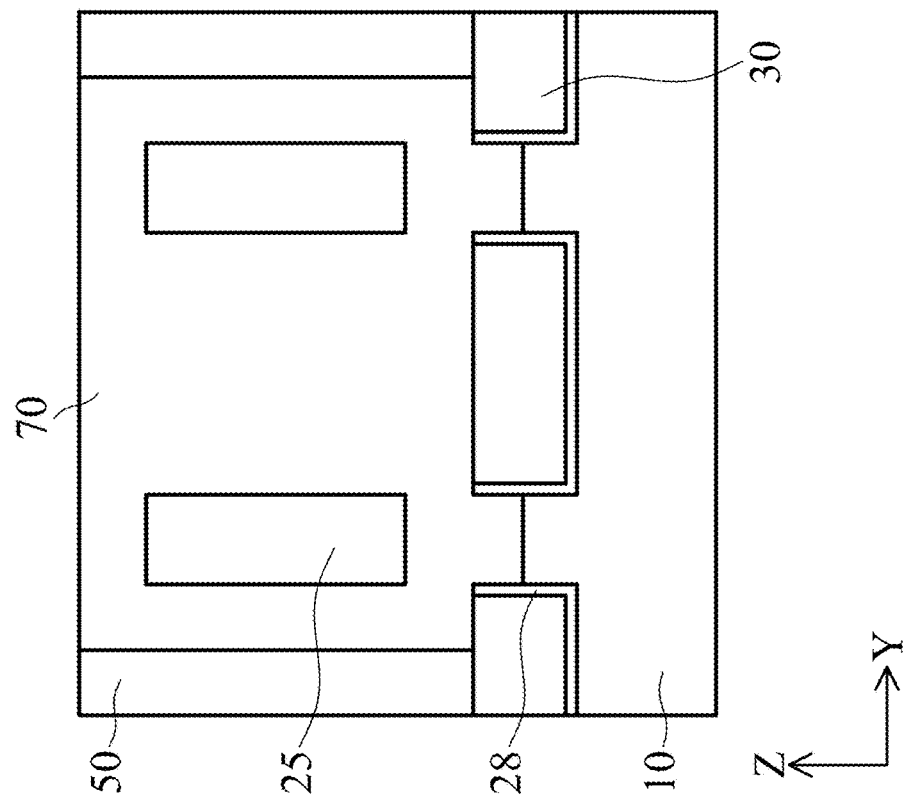

FIGS. 15A and 15B show one of the various stages of sequential processes for manufacturing a semiconductor device having a GAA FET according to an embodiment of the present disclosure. FIG. 15A is a cross sectional view corresponding to line Y1-Y1 of FIG. 15B.

Then, an insulating material layer 70 including one or more layers of insulating material is formed to fill the first source/drain opening as shown in FIG. 15A. The insulating material for the insulating material layer 70 is different from that of the ILD layer 50, and may include silicon oxide, silicon nitride, silicon oxynitride (SiON), SiOCN, SiOC, SiCN, fluorine-doped silicate glass (FSG), or a low-k dielectric material, formed by LPCVD (low pressure chemical vapor deposition), plasma-CVD, atomic layer deposition (ALD) or flowable CVD, or any other suitable film formation methods. In some embodiments, the insulating material layer 70 includes SiCO or SiOCN. An anneal operation may be performed after the formation of the insulating material layer 70.

Figures 16A, 16B:
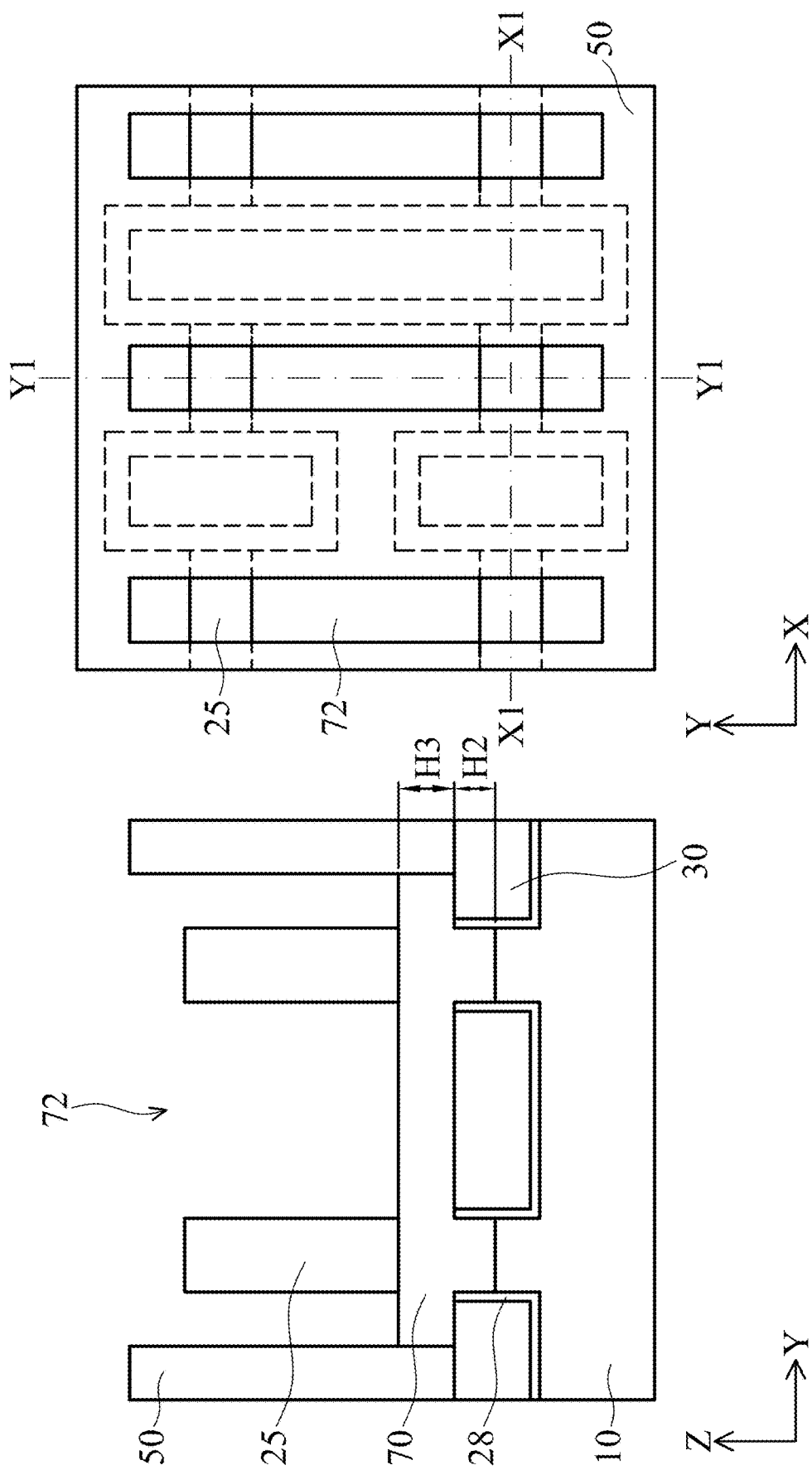
FIGS. 16A, 16B and 16C show one of the various stages of sequential processes for manufacturing a semiconductor device having a GAA FET according to an embodiment of the present disclosure.
Figure 16C:
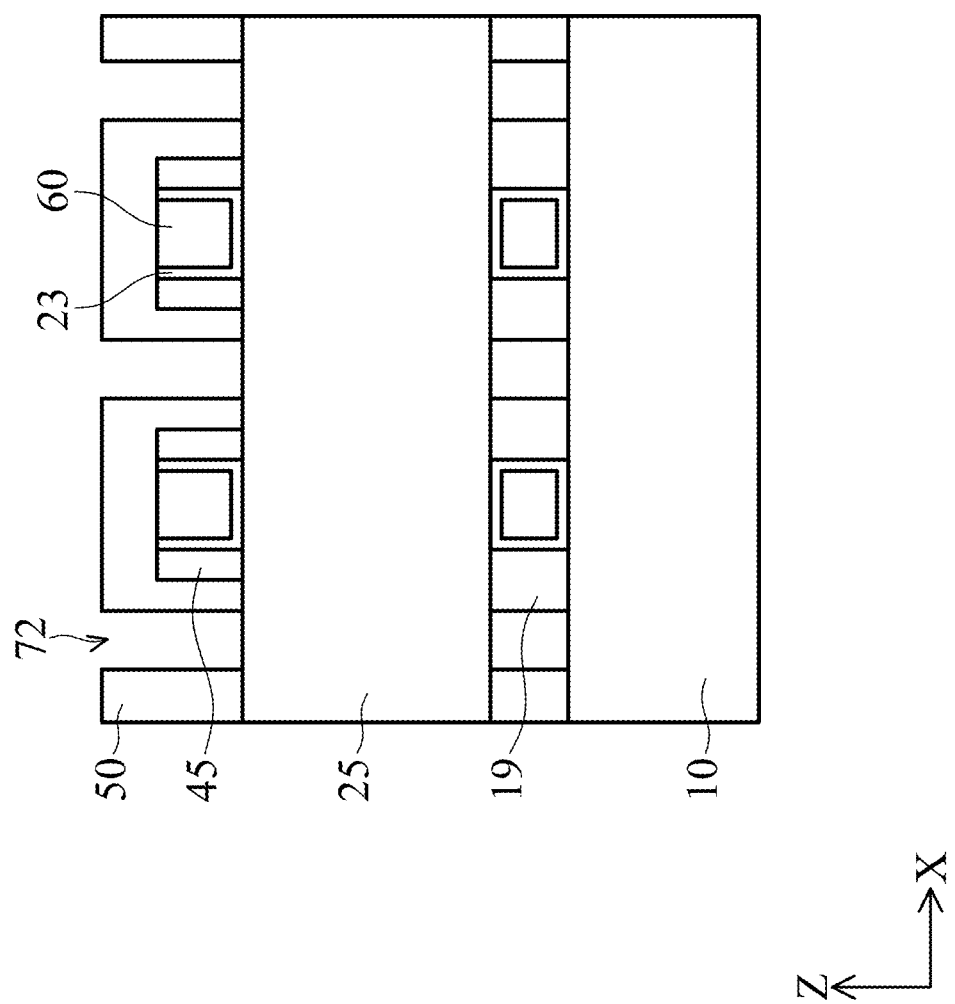

FIGS. 16A-16C show one of the various stages of sequential processes for manufacturing a semiconductor device having a GAA FET according to an embodiment of the present disclosure. FIG. 16A is a cross sectional view corresponding to line Y1-Y1 of FIG. 16B, and FIG. 16C is a cross sectional view corresponding to line X1-X1 of FIG. 16B.

Then, the insulating material layer 70 is recessed, thereby forming a second source/drain opening 72, as shown in FIGS. 16A and 16B. Since the insulating material layer 70 is made of a different material than the ILD layer 50, the insulating material layer 70 can be selectively etched with respect to the ILD layer 50. In certain embodiments, the insulating material layer 70 can be etched without a resist mask to expose the insulating material layer 70 and to cover the ILD layer around the insulating material layer 70.

The thickness H2 of the insulating material layer 70 under the second semiconductor layer 25 is substantially the same as the thickness of the first semiconductor layer 20, and is in a range from about 5 nm to about 30 nm in some embodiments, and is in a range from about 10 nm to about 20 nm in other embodiments. The thickness H3 of the insulating material layer 70 on the first isolation insulating layer 30 is in a range from about 2 nm to about 20 nm in some embodiments, and is in a range from about 5 nm to about 15 nm in other embodiments.

Figure 17C:
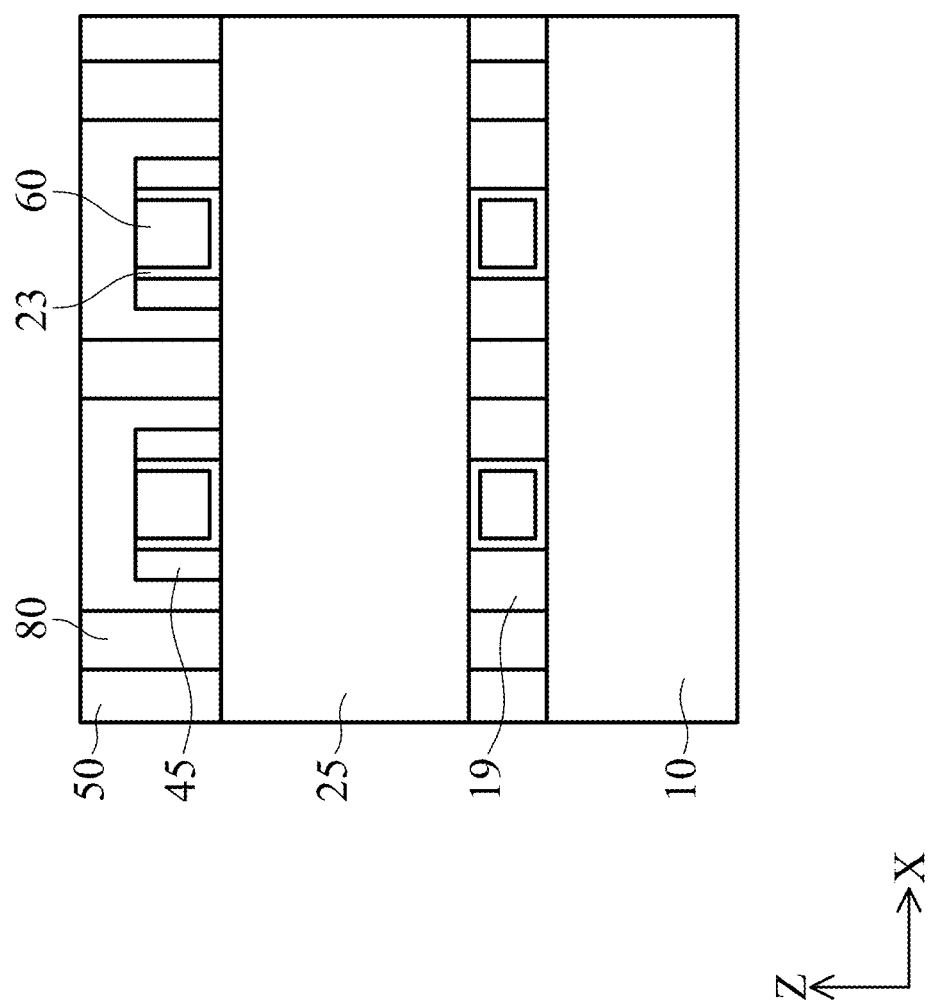

FIGS. 17A-17C show one of the various stages of sequential processes for manufacturing a semiconductor device having a GAA FET according to an embodiment of the present disclosure. FIG. 17A is a cross sectional view corresponding to line Y1-Y1 of FIG. 17B, and FIG. 17C is a cross sectional view corresponding to line X1-X1 of FIG. 17B.

After the insulating material layer 70 is recessed, in the second source/drain opening 72, a conductive material is formed. The conductive material is formed in and over the second source/drain opening 72 and then a planarization operation, such as a CMP operation, is performed to form source/drain contacts 80, as shown in FIGS. 17A and 17B. The conductive material includes one or more layers of Co, Ni. W, Ti, Ta, Cu, Al, TiN and TaN, or any other suitable material.

Figures 18A, 18B:
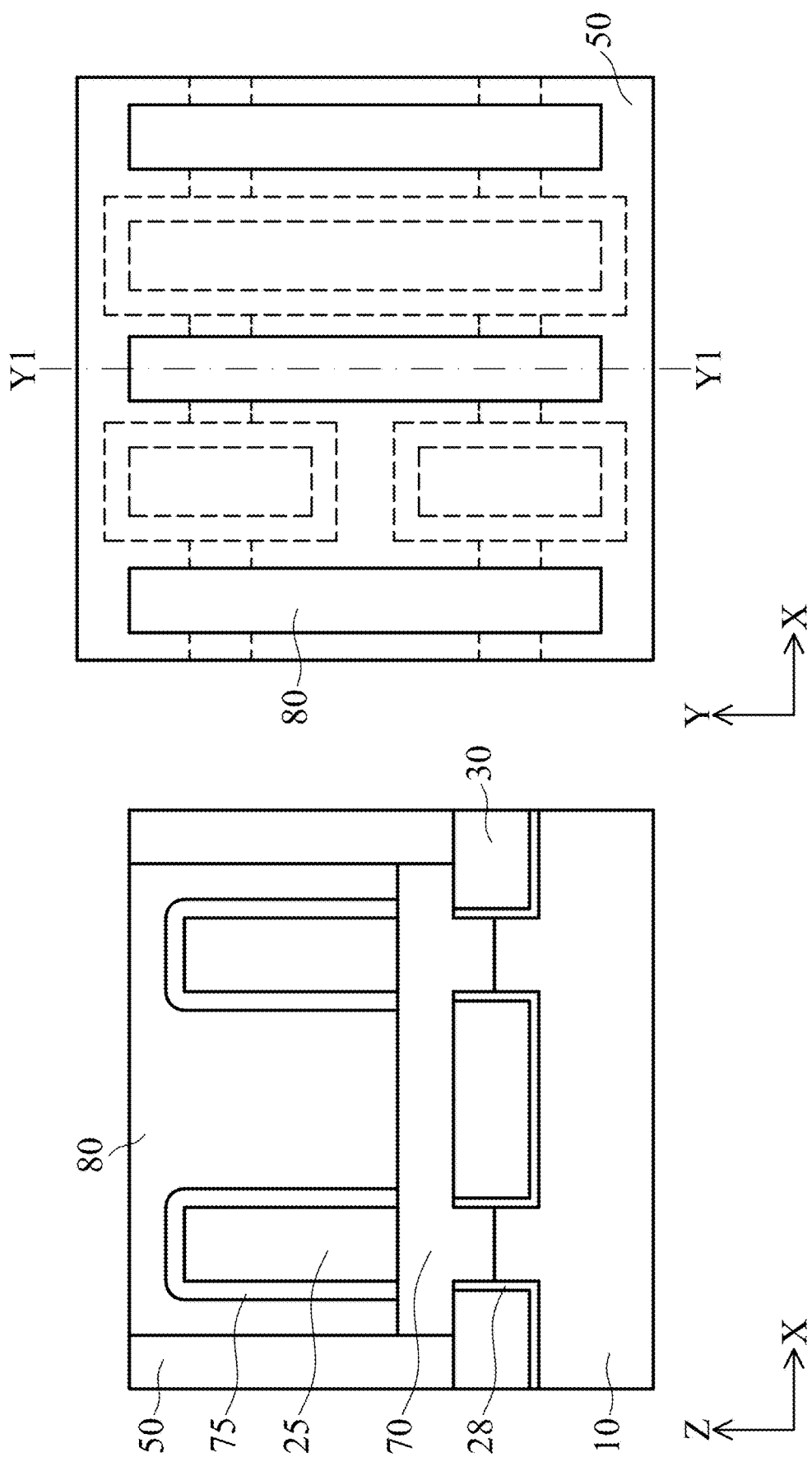
FIGS. 18A and 18B show a semiconductor device having a GAA FET according to another embodiment of the present disclosure.

In some embodiments, a silicide layer 75 is formed over the second semiconductor layer 25 before forming the conductive material, as shown in FIGS. 18A and 18B. The silicide layer includes one or more of WSi, CoSi, NiSi, TiSi, MoSi and TaSi. When the second semiconductor layer includes Ge, an alloy of Ge and metal (e.g., TiGe, NiGe, or CoGe) is formed, and when the epitaxial layer includes Si and Ge, an alloy of Si, Ge and metal (e.g., NiSiGe or TiSiGe) is formed. When the second semiconductor layer includes a Group III-V semiconductor, an alloy such as Ni—InAlAs is formed.

It is understood that the GAA FET undergoes further CMOS processes to form various features such as contacts/vias, interconnect metal layers, dielectric layers, passivation layers, etc.

As shown in FIGS. 17A-18B, a bottom of the source/drain region (second semiconductor layer 25) is separated from the substrate 10 (a bottom portion of the fin structure protruding from the substrate 10) by the insulating material layer 70 made of a different material than the isolation insulating layer 30 and the ILD layer 50. With this structure, the source/drain regions are electrically separated from the substrate and a parasitic transistor is not formed.

FIGS. 19A-23B show sequential processes for manufacturing a semiconductor device having a GAA FET according to another embodiment of the present disclosure. It is understood that additional operations can be provided before, during, and after processes shown by FIGS. 19A-23B, and some of the operations described below can be replaced or eliminated, for additional embodiments of the method. The order of the operations/processes may be interchangeable. Material, configuration, dimensions and/or processes the same as or similar to the foregoing embodiments described with respect to FIGS. 1A-18B may be employed in the following embodiments, and detailed explanation thereof may be omitted.

In the foregoing embodiment, one channel layer (semiconductor wire) is formed from the fin structure. In the embodiments with respect to FIGS. 19A-23B, multiple semiconductor wires vertically arranged are formed from one fin structure.

Figures 19A, 19B:
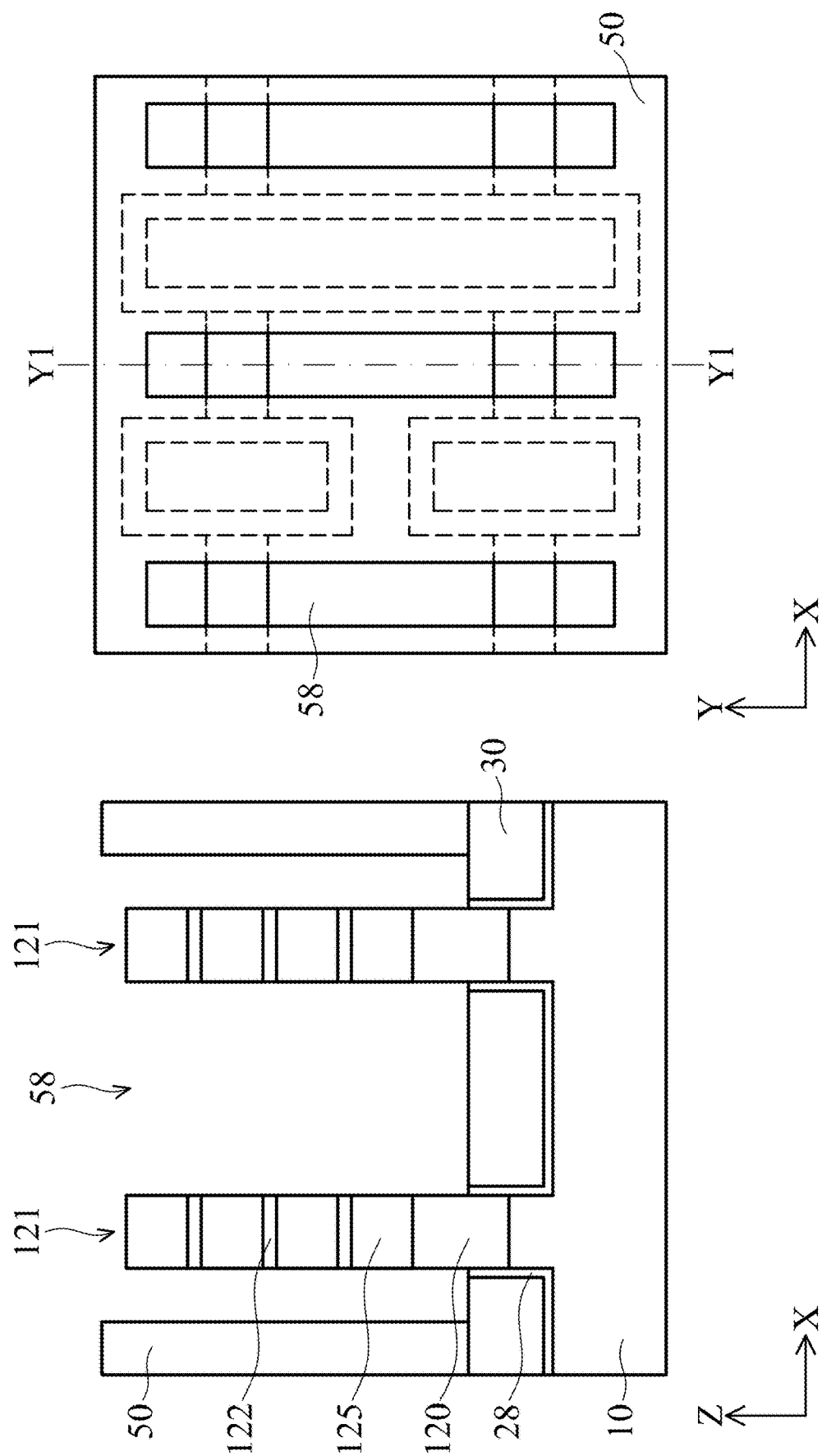
FIGS. 19A and 19B show one of the various stages of sequential processes for manufacturing a semiconductor device having a GAA FET according to another embodiment of the present disclosure.

FIGS. 19A and 19B show one of the various stages of sequential processes for manufacturing a semiconductor device having a GAA FET according to another embodiment of the present disclosure. FIG. 19A is a cross sectional view corresponding to line Y1-Y1 of FIG. 19B.

FIGS. 19A and 19B correspond to FIGS. 13A and 13B after the first source/drain opening 58 is formed. As shown in FIG. 19A, the fin structure 121 includes multiple layers of first semiconductor layers 120 and 122 and second semiconductor layers 125 alternately stacked. In one embodiment, the first semiconductor layers 120 and 122 are made of SiGe and the second semiconductor layers 125 are made of Si. The first and second semiconductor layers are alternately epitaxially formed over the substrate 10 and the fin structures 121 are formed by patterning operations performed similar to FIGS. 1A-2B as set forth above. In some embodiments, the thickness of the bottommost first semiconductor layer 120 is greater than the thickness of the remaining first semiconductor layers 122. Although FIG. 19A shows four second semiconductor layers 125, the number of the second semiconductor layer can be two, three or more than four.

FIGS. 20A and 20B show one of the various stages of sequential processes for manufacturing a semiconductor device having a GAA FET according to another embodiment of the present disclosure. FIG. 20A is a cross sectional view corresponding to line Y1-Y1 of FIG. 20B.

Then, similar to the operations explained with respect to FIGS. 14A-16B, the first semiconductor layers 120 and 122 are removed in the first source/drain opening 58, and the recessed insulating material layer 70 is formed, as shown in FIG. 20A. In some embodiments, a space is formed between the bottommost second semiconductor layer 125 and the insulating material layer 70. In other embodiments, a part of the bottommost second semiconductor layer 125 is embedded in the insulating material layer 70.

Figures 21A, 21B:
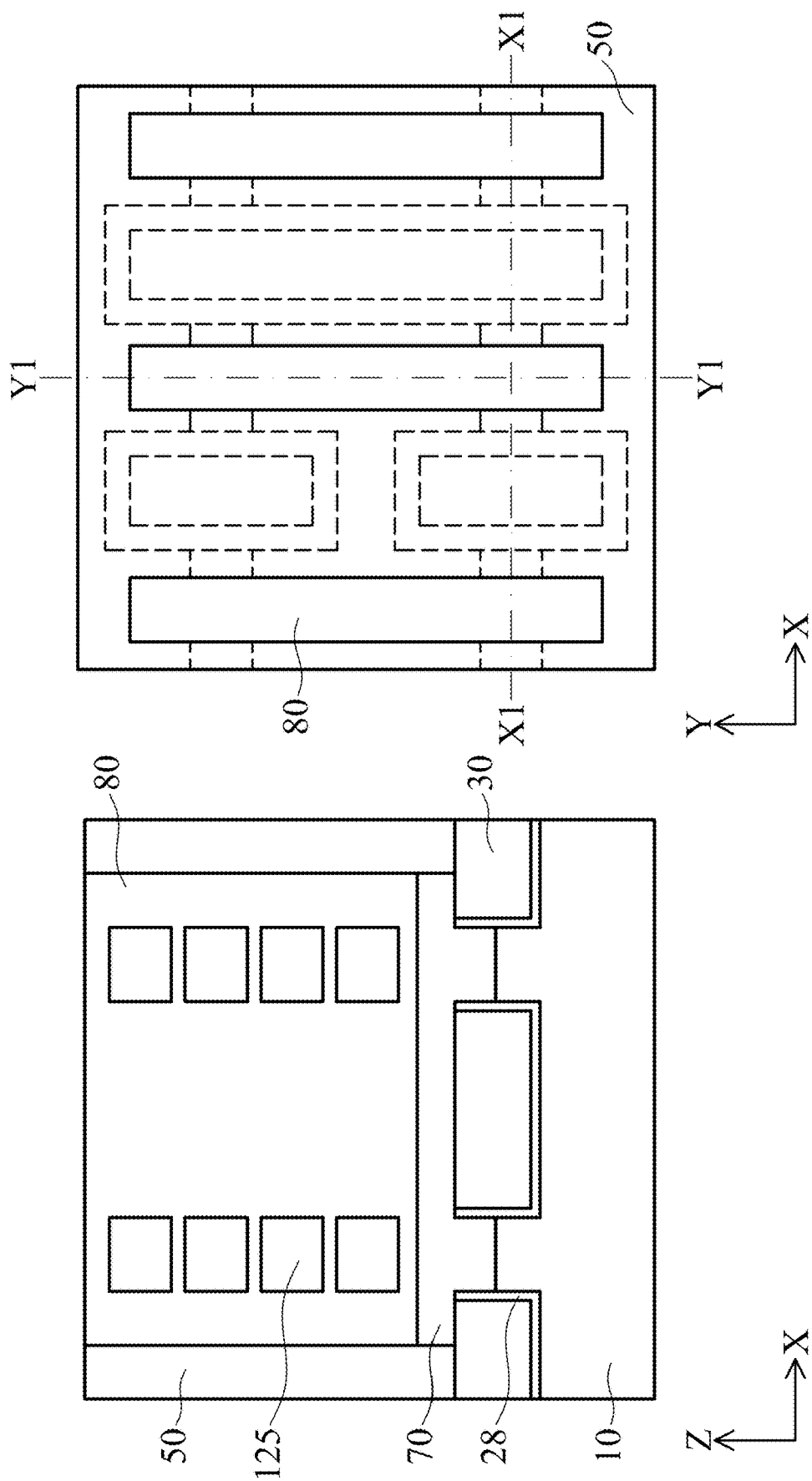
FIGS. 21A, 21B and 21C show one of the various stages of sequential processes for manufacturing a semiconductor device having a GAA FET according to another embodiment of the present disclosure.
Figure 21C:
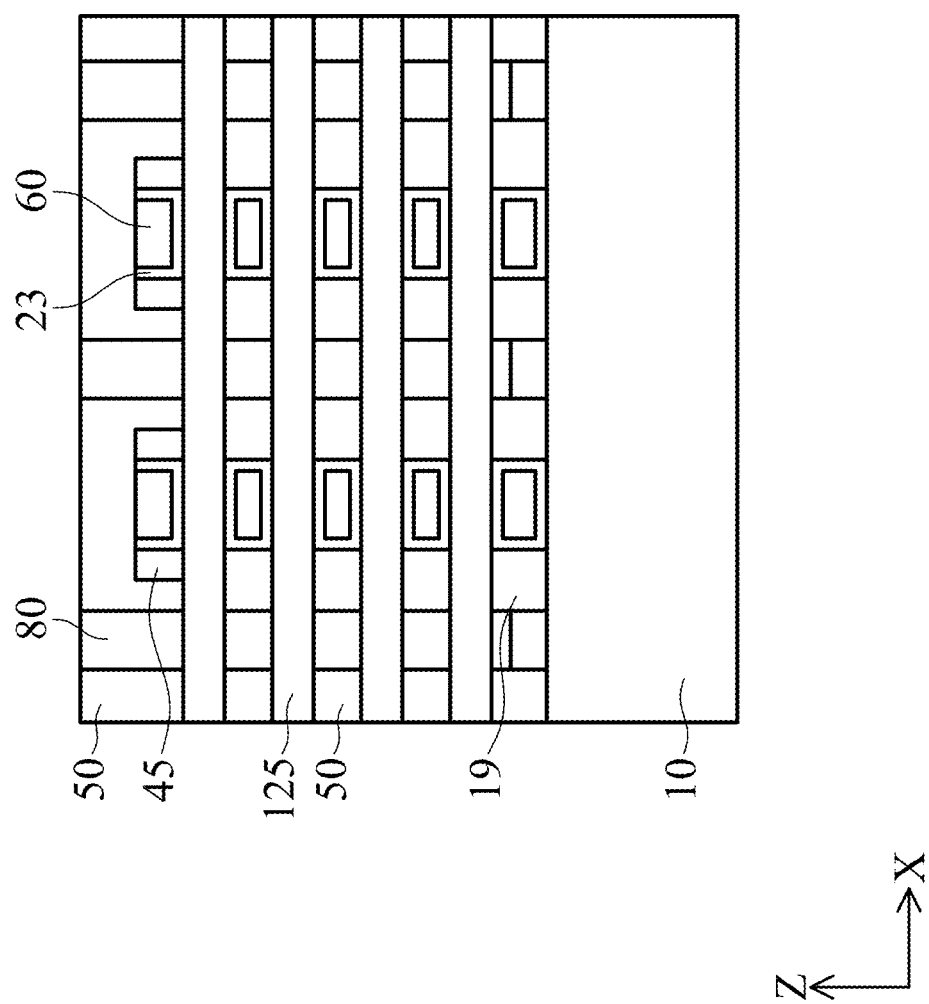

FIGS. 21A-21C show one of the various stages of sequential processes for manufacturing a semiconductor device having a GAA FET according to another embodiment of the present disclosure. FIG. 21A is a cross sectional view corresponding to line Y1-Y1 of FIG. 21B, and FIG. 21C is a cross sectional view corresponding to line X1-X1 of FIG. 21B.

Similar to the operations explained with respect to FIGS. 17A and 17B, a source/drain contact layer 80 is formed, as shown in FIGS. 21A and 21B.

Figures 22A, 22B:
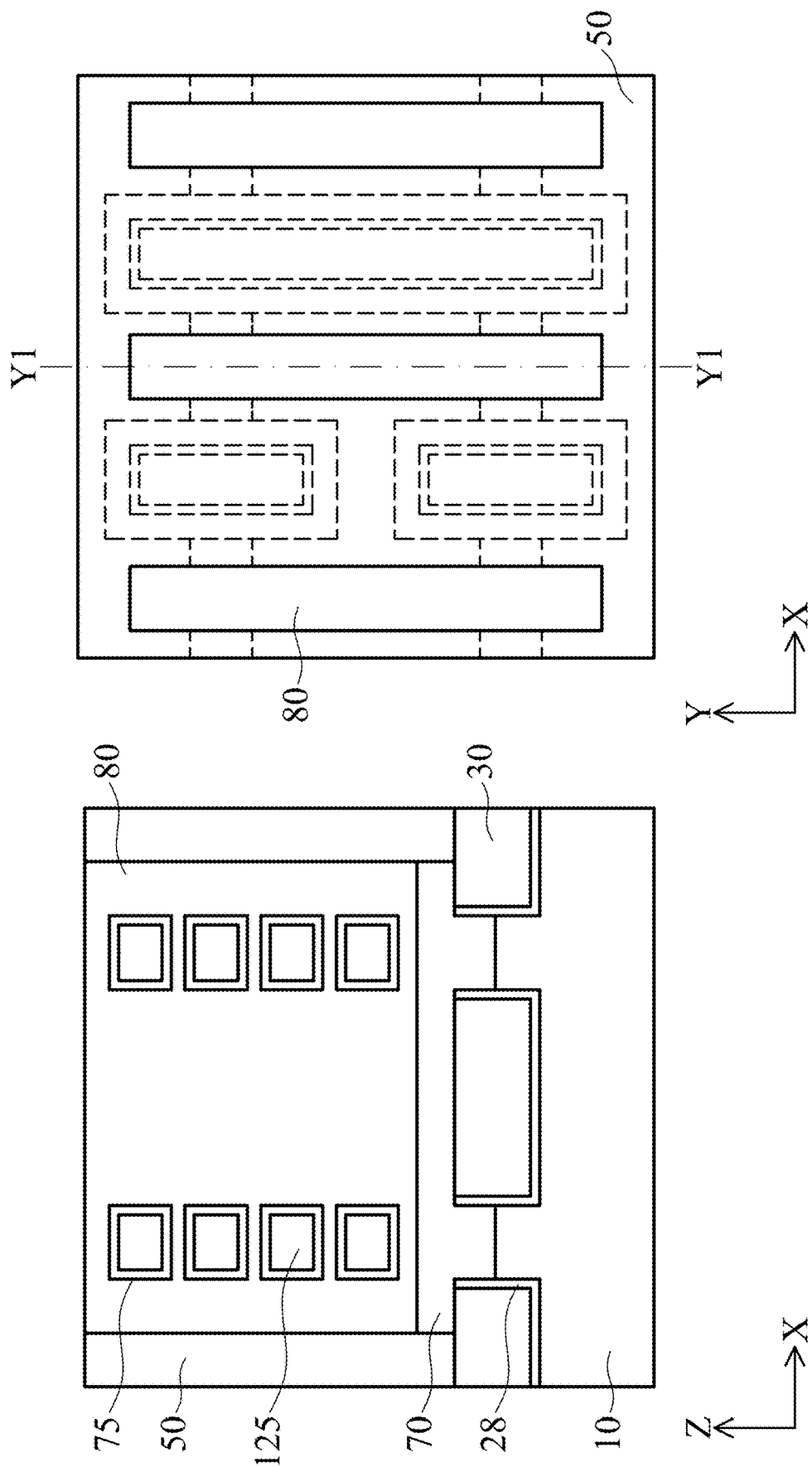
FIGS. 22A and 22B show a semiconductor device having a GAA FET according to another embodiment of the present disclosure.

In some embodiments, a silicide layer 75 is formed over the second semiconductor layers 125 before forming the conductive material, as shown in FIGS. 22A and 22B.

FIG. 23A is a cross sectional view corresponding to line Y2-Y2 of FIG. 23B, which correspond to FIGS. 11A and 11B. As shown in FIG. 23A, a plurality of channel layers 125 are vertically arranged and each of the channel layer 125 is wrapped by the gate dielectric layer 92 and the gate electrode layer 94.

Similar to the operations explained with respect to FIGS. 5A-11B, a dummy gate structure is formed over the upper portion of the fin structure with stacked layers of the first and second semiconductor layer. Then, a sidewall spacer is formed on opposing side faces of the dummy gate structure. Next, the dummy gate structure is removed, and thus a gate space surrounded by the sidewall space layer is formed, in which the upper portion of the fin structure is exposed. The first semiconductor layers are removed from the upper portion in the gate space. By removing the first semiconductor layers, semiconductor wires formed by the second semiconductor layers are obtained. A gate dielectric layer is formed to wrap the second semiconductor layers. Then, a metal gate electrode layer is formed over the gate dielectric layer, thereby obtaining the structure of FIGS. 23A and 23B.

FIGS. 24A and 24B show a semiconductor device having a FinFET according to another embodiment of the present disclosure. Material, configuration, dimensions and/or processes the same as or similar to the foregoing embodiments described with respect to FIGS. 1A-23B may be employed in the following embodiments, and detailed explanation thereof may be omitted.

In this embodiments, a fin structure 25 formed by a second semiconductor layer is employed as a channel region of a FET, as shown in FIG. 24A, while the source/drain structure has the same structure as shown in FIG. 17 or 18. The fin structure 25 is disposed over the first semiconductor layer 20, which is not removed. It is understood that the GAA FET undergoes further CMOS processes to form various features such as contacts/vias, interconnect metal layers, dielectric layers, passivation layers, etc.

Figure 25A:
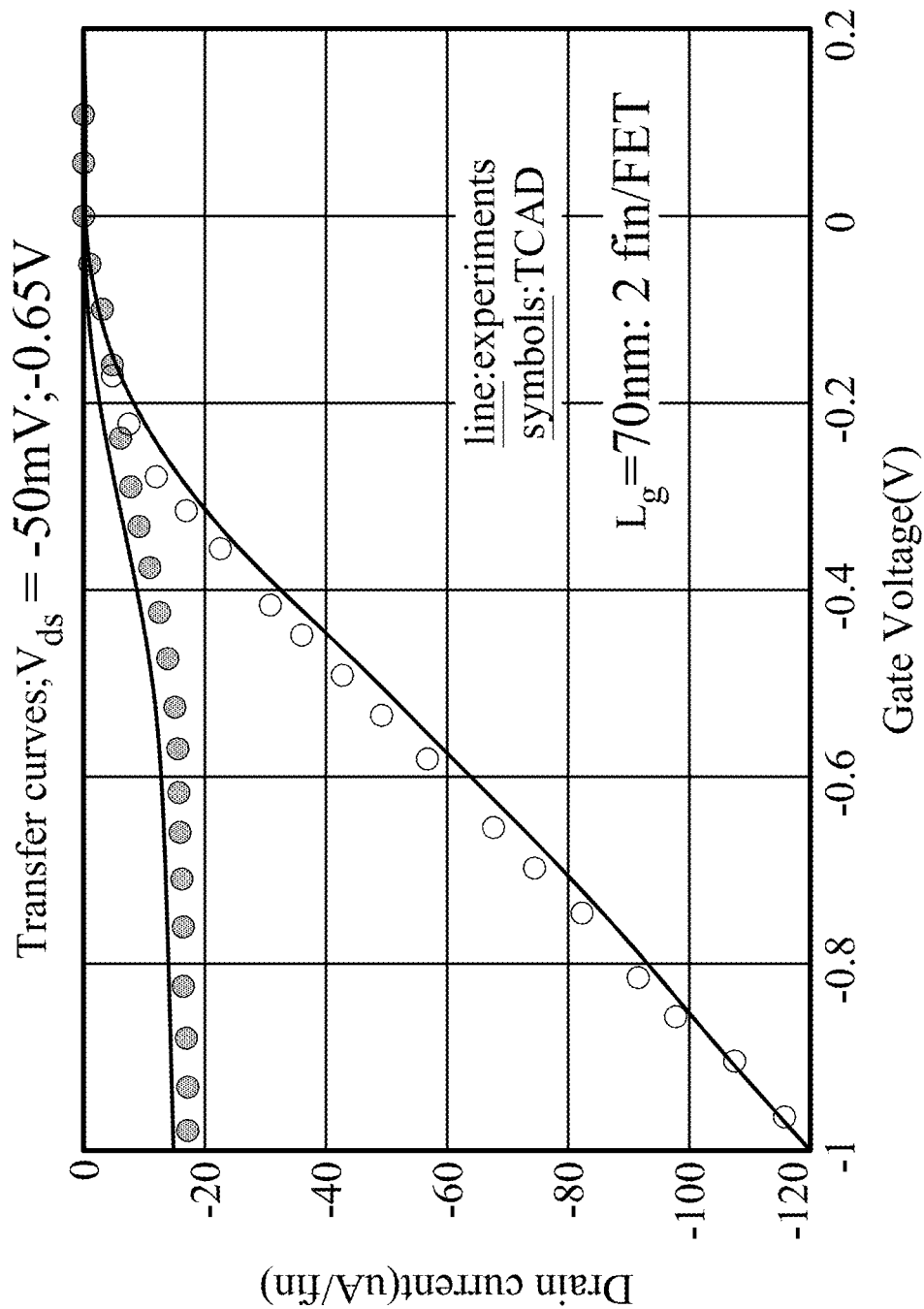
FIGS. 25A and 25B are experimental and simulation results showing the effects of the present embodiments.
Figure 25B:
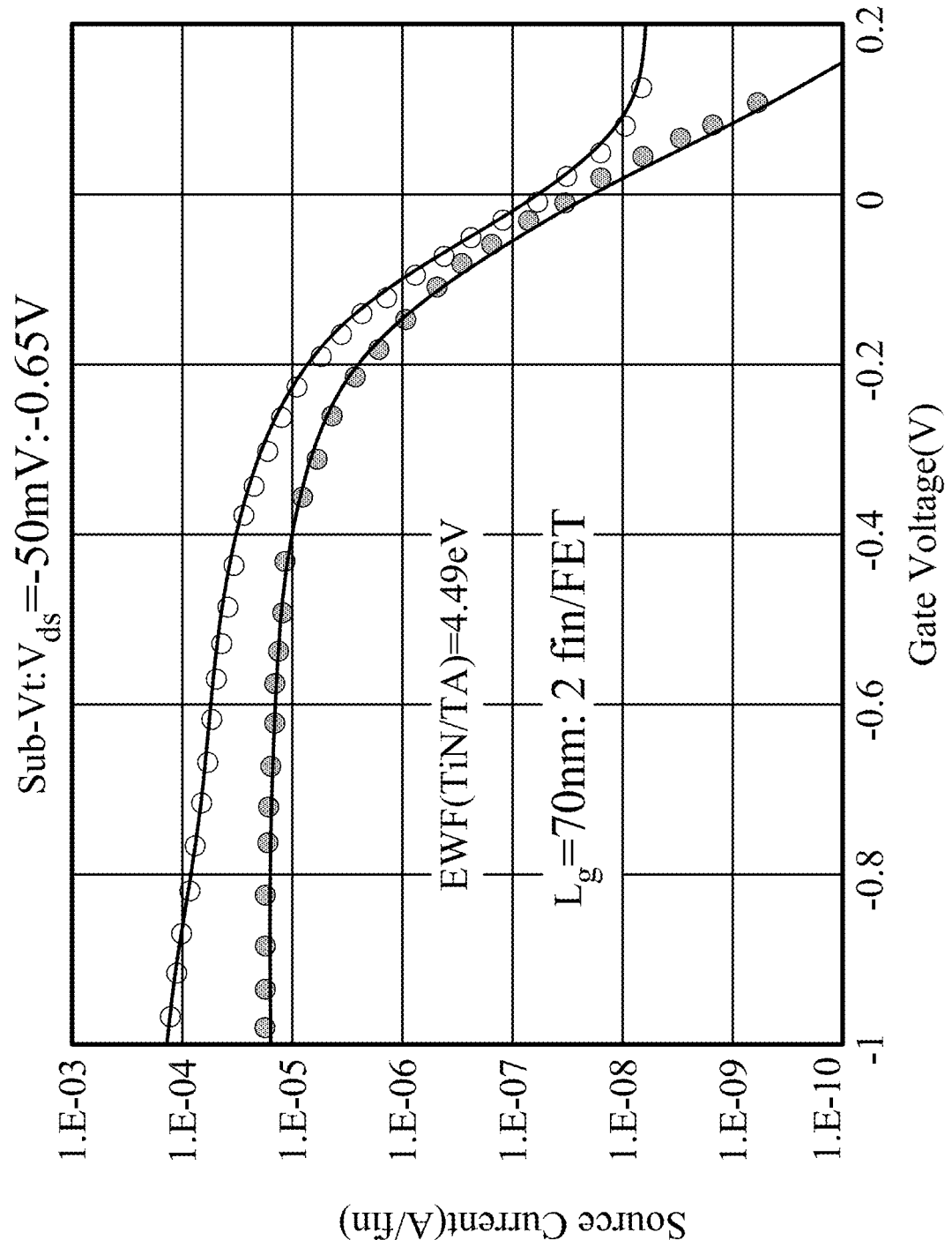

FIGS. 25A and 25B show correspondence between the simulation (model) and the experiments. These figures show Id/Vg properties at Vds=−0.05 V and −0.65 V of a gate having Lg=70 nm with three vertically stacked Ge nanowire device (2-fin structure). FIG. 25A shows a linear plot and FIG. 25B shows a log plot. Solid lines are experimental results and dots (black and white) are simulation results. It can be confirmed from FIGS. 25A and 25B that the model for the simulation well reproduces the actual device behavior.

Figure 26A:
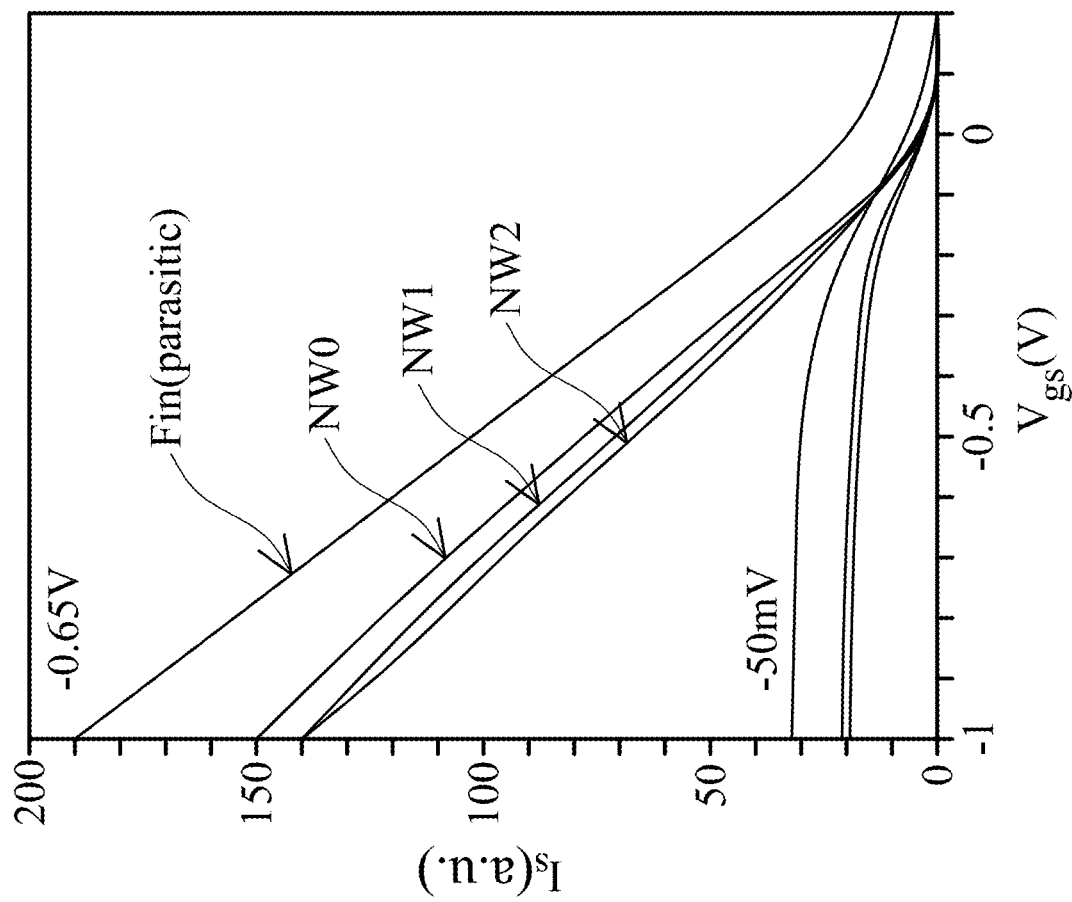
FIGS. 26A and 26B are experimental and simulation results showing the effects of the present embodiments.
Figure 26B:
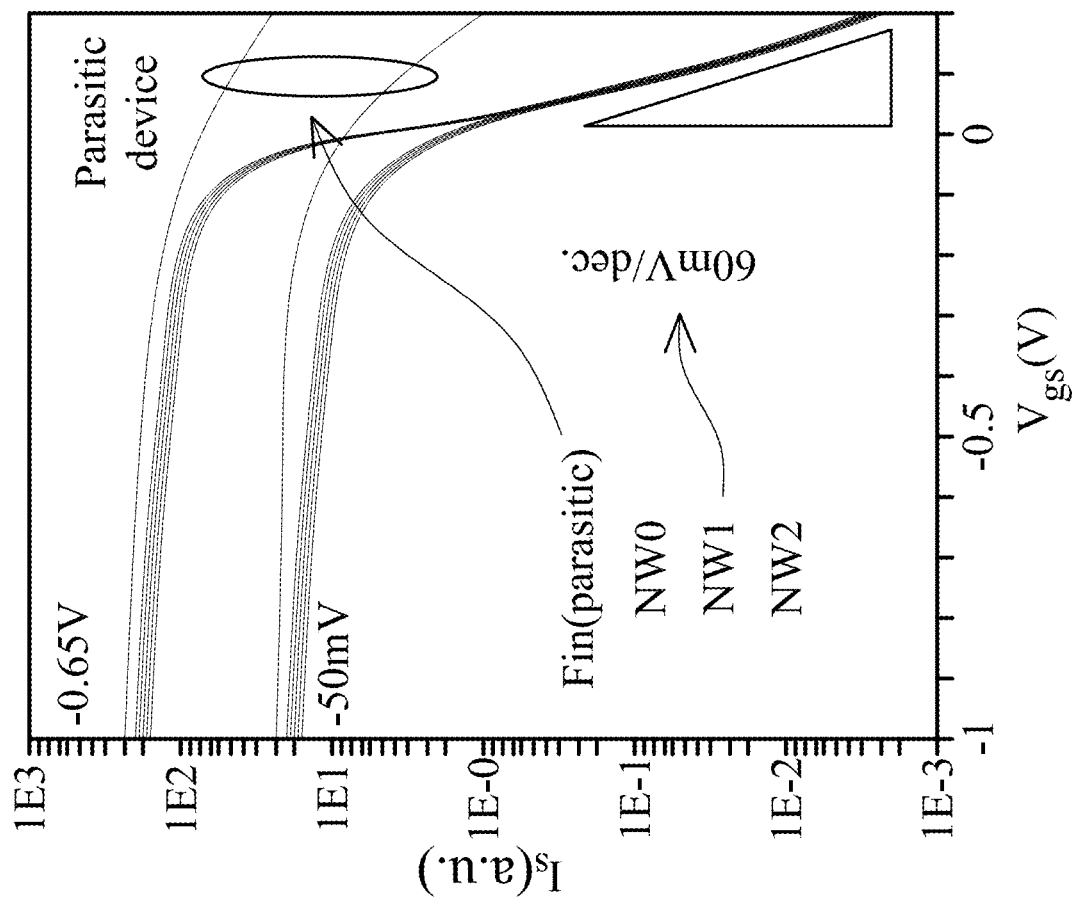

When a SiGe layer (a sacrificial layer) remains between the bottommost nanowire and the substrate (bottom fin), the isolation of the fin and the nanowires is in sufficient. In contrast, in the foregoing embodiments, the SiGe layer is replaced with a dielectric layer 70. FIGS. 26A and 26B show the simulated Is/Vg properties at Vds=−0.05 V and −0.65V of a gate having Lg=30 nm with three vertically stacked Ge nanowire device (2-fin structure). FIG. 26A shows a linear plot and FIG. 26B shows a log plot for the three individual NW FETs and the parasitic bottom FinFET. The subthreshold slope of the individual NW FETs is close to the ideal 60 mV/dec, while the parasitic device has a much poorer slope. Accordingly, it can be understood that by isolating the fin by the dielectric layer 70 can improve the device property.

Figures 27A, 27B:
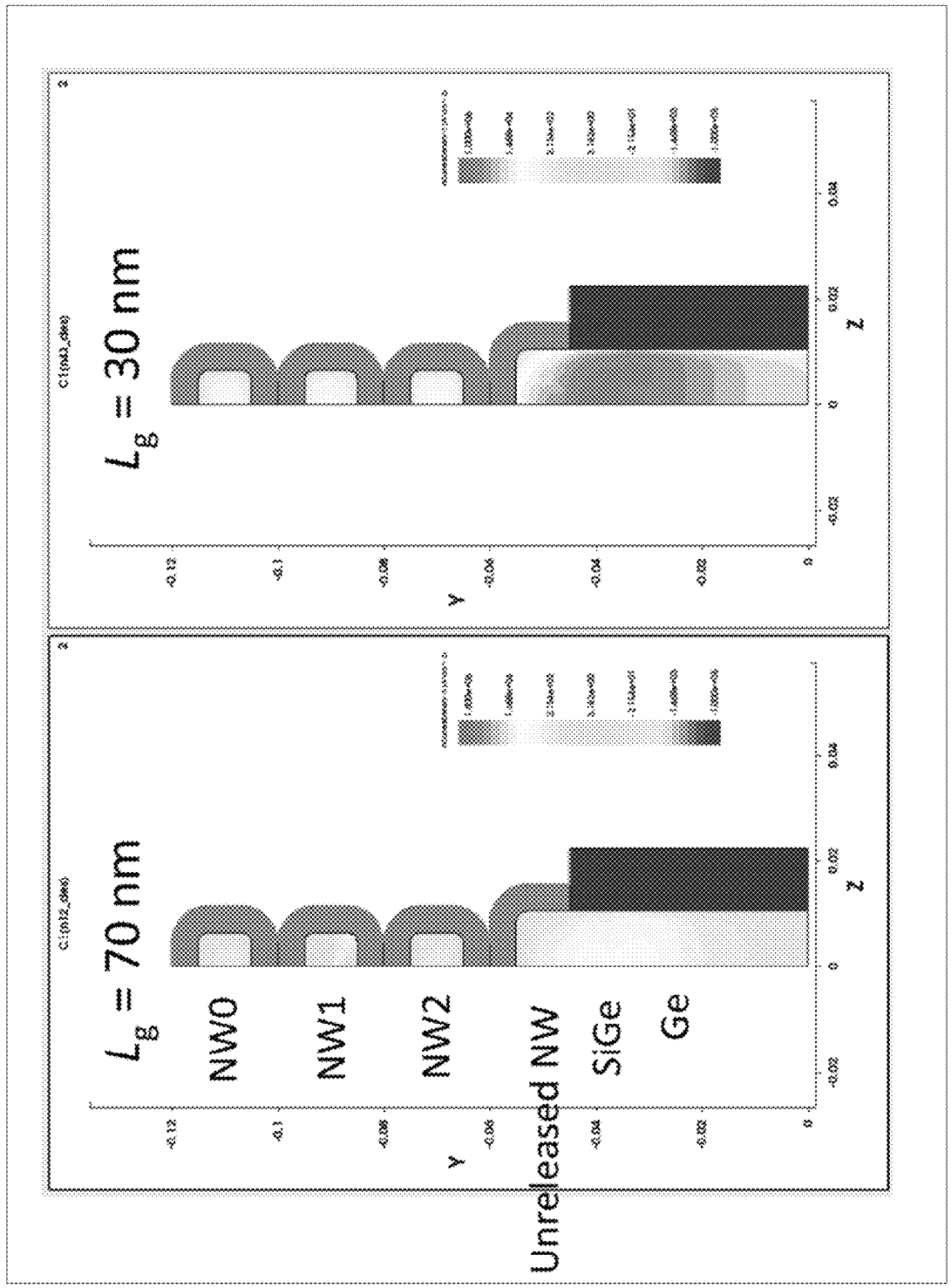
FIGS. 27A and 27B are experimental and simulation results showing the effects of the present embodiments.

FIGS. 27A and 27B shows off-current properties obtained by simulation. FIGS. 27A and 27B show hole current density maps of three vertically stacked Ge nanowire device at Lg=70 nm (FIG. 27A) and Lg=30 nm (FIG. 27B) at Vg=0V and Vds=−0.65V (off-state conditions). In particular, at Lg=30 nm, a high hole current density is observed in the parasitic bottom FinFET explaining the poor short channel effect control (i.e., high subthreshold slope) leading to undesired high off-state leakage, at scaled gate lengths. Again, these figures show the necessity to remove the parasitic transistor from the stacked nanowire device. As set forth above, in the FETs of the present disclosure, the source/drain regions are isolated from the substrate (bottom fin) and thus no parasitic transistor exists.

The various embodiments or examples described herein offer several advantages over the existing art. For example, in the present disclosure, since an insulating material layer is inserted between the bottom of the source/drain region and the substrate (a protruding portion of the substrate is a bottom of the fin structure), it is possible to prevent formation of a parasitic transistor and to reduce an off-state leakage current. Further, by using a different insulating material as the insulating material layer than the ILD layer and/or the isolation insulating layer, the process to form the insulating material layer becomes easier.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a fin structure having a bottom portion, an intermediate portion disposed over the bottom portion and an upper portion disposed over the intermediate portion is formed. The intermediate portion is removed at a source/drain region of the fin structure, thereby forming a space between the bottom portion and the upper portion. An insulating layer is formed in the space. A source/drain contact layer is formed over the upper portion. The source/drain contact layer is separated by the insulating layer from the bottom portion of the fin structure. In one or more of the foregoing or following embodiments, in the method, before the intermediate layer is removed, a dielectric layer is formed over the fin structure, and the dielectric layer is patterned, thereby forming an opening in which the upper portion of the fin structure and at least a part of the intermediate portion of the fin structure are exposed. The intermediate portion is removed in the opening and the insulating layer is formed in the opening. In one or more of the foregoing or following embodiments, the insulating layer and the dielectric layer are made of different material from each other. In one or more of the foregoing or following embodiments, the insulating layer is made of SiCO. In one or more of the foregoing or following embodiments, the dielectric layer is made of silicon oxide. In one or more of the foregoing or following embodiments, the intermediate layer is made of $Si_xGe_{1-x}$ and the upper portion is made of $Si_yGe_{1-y}$, where x<y. In one or more of the foregoing or following embodiments, the intermediate layer is made of $Si_xGe_{1-x}$, where 0.1<x<0.9, and the upper portion and the bottom portion are made of Si.

In accordance with another aspect of the present disclosure, in a method of manufacturing a semiconductor device, a fin structure having a bottom portion, an intermediate portion disposed over the bottom portion and an upper portion disposed over the intermediate portion is formed. A dielectric layer is formed over the fin structure. A metal gate structure is formed over a channel region of the fin structure. The dielectric layer is patterned, thereby forming an opening in which the upper portion of the fin structure and at least a part of the intermediate portion of the fin structure are exposed. The intermediate portion is removed at a source/drain region of the fin structure in the opening, thereby forming a space between the bottom portion and the upper portion. An insulating layer is formed in the space. A source/drain contact layer is formed over the upper portion. The source/drain contact layer is separated by the insulating layer from the bottom portion of the fin structure. In one or more of the foregoing or following embodiments, the metal gate structure is formed by the following operations: a dummy gate structure is formed over the channel region of the fin structure, a sidewall spacer is formed on opposing side faces of the dummy gate structure, the dummy gate structure is removed, thereby forming a gate space surrounded by the sidewall space layer in which the channel region is exposed, a gate dielectric layer is formed over the exposed channel region, and a metal gate electrode layer is formed over the gate dielectric layer. In one or more of the foregoing or following embodiments, the exposed channel region includes the upper portion of the fin structure and at least a part of the intermediate portion, and the intermediate portion is removed before the gate dielectric layer is formed. In one or more of the foregoing or following embodiments, the insulating layer and the dielectric layer are made of different material from each other. In one or more of the foregoing or following embodiments, the insulating layer, the dielectric layer and the sidewall spacer layer are made of different material from each other. In one or more of the foregoing or following embodiments, the insulating layer is made of SiCO. In one or more of the foregoing or following embodiments, the dielectric layer is made of silicon oxide. In one or more of the foregoing or following embodiments, the intermediate layer is made of $Si_xGe_{1-x}$ and the upper portion is made of $Si_yGe_{1-y}$, where x<y. In one or more of the foregoing or following embodiments, the intermediate layer is made of $Si_xGe_{1-x}$, where 0.1<x<0.9, and the upper portion and the bottom portion are made of Si.

In accordance with another aspect of the present disclosure, in a method of manufacturing a semiconductor device, a fin structure is formed. The fin structure has a bottom portion, an intermediate portion disposed over the bottom portion and an upper portion disposed over the intermediate portion. The upper portion includes stacked layers of one or more first semiconductor material layers and one or more second semiconductor layers. The intermediate portion are removed at a source/drain region of the fin structure, thereby forming a space between the bottom portion and the upper portion. An insulating layer is formed in the space. A source/drain contact layer is formed over the upper portion. The source/drain contact layer is separated by the insulating layer from the bottom portion of the fin structure. In one or more of the foregoing or following embodiments, the one or more first semiconductor layers are removed from the upper portion when the intermediate portion is removed, and the source/drain contact layer wraps around the one or more second semiconductor layers. In one or more of the foregoing or following embodiments, the bottom portion of the fin structure is embedded in an isolation insulating layer, and the insulating layer and the isolation insulating layer are made of different materials from each other. In one or more of the foregoing or following embodiments, in the method, a dummy gate structure is formed over the upper portion of the fin structure, a sidewall spacer is formed on opposing side faces of the dummy gate structure, the dummy gate structure is removed, thereby forming a gate space surrounded by the sidewall space layer in which the upper portion is exposed, the one or more first semiconductor layers are removed from the upper portion in the gate space, a gate dielectric layer is formed to wrap the one or more second semiconductor layers, and a metal gate electrode layer is formed over the gate dielectric layer.

In accordance with one aspect of the present disclosure, a semiconductor device includes a semiconductor wire structure having a channel region and a source/drain region. A source/drain contact layer is formed over the source/drain region. The source/drain contact layer is embedded in an dielectric layer. An isolation insulating layer is disposed between the dielectric layer and a substrate. A bottom of the source/drain region is separated from the substrate by an insulating layer made of a different material than the isolation insulating layer and the dielectric layer. In one or more of the foregoing or following embodiments, the insulating layer is made of SiCO. In one or more of the foregoing or following embodiments, the dielectric layer is made of silicon oxide. In one or more of the foregoing or following embodiments, the substrate includes a protrusion below the source/drain region, and the insulating layer is disposed between the bottom of the source/drain region and the protrusion. In one or more of the foregoing or following embodiments, the source/drain region of the semiconductor wire structure and the protrusion are made of a same material. In one or more of the foregoing or following embodiments, the semiconductor device further includes a gate structure including a gate dielectric layer and a metal gate electrode layer, and the gate dielectric layer wraps around the channel region of the semiconductor wire structure. In one or more of the foregoing or following embodiments, a silicide layer is disposed between the source/drain region and the source/drain contact layer. In one or more of the foregoing or following embodiments, a bottom of the source/drain contact layer is separated from the isolation insulating layer by the insulating layer.

In accordance with another aspect of the present disclosure, a semiconductor device includes a first semiconductor wire structure having a channel region and a source/drain region, and a second semiconductor wire structure having a channel region and a source/drain region. A source/drain contact layer is formed over the source/drain region of the first semiconductor wire structure and the source/drain region of the second semiconductor wire structure. The source/drain contact layer is embedded in a dielectric layer. An isolation insulating layer is disposed between the dielectric layer and a substrate. A bottom of the source/drain region of the first semiconductor wire structure and a bottom of the source/drain region of the second semiconductor wire structure are separated from the substrate by an insulating layer made of a different material than the isolation insulating layer and the dielectric layer. In one or more of the foregoing or following embodiments, the insulating layer is made of SiCO and the dielectric layer and isolation insulating layer are made of silicon oxide. In one or more of the foregoing or following embodiments, the substrate includes a first protrusion below the source/drain region of the first semiconductor wire structure and a second protrusion below the source/drain region of the second semiconductor wire structure. The insulating layer is disposed between the bottom of the source/drain region of the first semiconductor wire structure and the first protrusion and between the bottom of the source/drain region of the second semiconductor wire structure and the second protrusion. In one or more of the foregoing or following embodiments, the first and second semiconductor wire structures and the substrate are made of a same material. In one or more of the foregoing or following embodiments, the first and second semiconductor wire structures and the substrate are made of different materials. In one or more of the foregoing or following embodiments, the semiconductor device further includes a first gate structure including a gate dielectric layer and a metal gate electrode layer, and a second gate structure including a gate dielectric layer and a metal gate electrode layer, and the gate dielectric layer of the first gate structure wraps around the channel region of the first semiconductor wire structure, and the gate dielectric layer of the second gate structure wraps the channel region of the second semiconductor wire structure. In one or more of the foregoing or following embodiments, a first silicide layer is disposed between the source/drain region of the first semiconductor wire structure and the source/drain contact layer, and a second silicide layer is disposed between the source/drain region of the second semiconductor wire structure and the source/drain contact layer. In one or more of the foregoing or following embodiments, a bottom of the source/drain contact layer is separated from the isolation insulating layer by the insulating layer.

In accordance with another aspect of the present disclosure, a semiconductor device includes semiconductor wire structures, which have a channel region and a source/drain region. A source/drain contact layer is formed over the source/drain region wrapping around the semiconductor wires. The source/drain contact layer is embedded in an dielectric layer. An isolation insulating layer is disposed between the dielectric layer and a substrate. A bottom of the source/drain region is separated from the substrate by an insulating layer made of a different material than the isolation insulating layer and the dielectric layer. In one or more of the foregoing or following embodiments, the insulating layer is made of SiCO. In one or more of the foregoing or following embodiments, the substrate includes a protrusion below the source/drain region, and the insulating layer is disposed between the bottom of the source/drain region and the protrusion. In one or more of the foregoing or following embodiments, the protrusion continuously extends from the substrate and is made of a same material as the substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a semiconductor wire structure horizontally extending over a substrate and having a channel region, and a source region and a drain region disposed at ends of the channel region in a horizontal direction, wherein:
a source contact layer is formed over the source region,
the source contact layer is embedded in an dielectric layer,
an isolation insulating layer is disposed between the dielectric layer and the substrate,
a bottom of the source region is separated from the substrate by an insulating layer made of a different material than the isolation insulating layer and the dielectric layer, and a bottom of the drain region is separated from the substrate by the insulating layer,
the substrate includes a protrusion below the source region, and
the insulating layer is disposed between the bottom of the source region and the protrusion.

2. The semiconductor device of claim 1, wherein the insulating layer is made of SiCO.

3. The semiconductor device of claim 2, wherein the dielectric layer is made of silicon oxide.

4. The semiconductor device of claim 1, the source region of the semiconductor wire structure and the protrusion are made of a same material.

5. The semiconductor device of claim 1, further comprising:
a gate structure including a gate dielectric layer and a metal gate electrode layer,
wherein the gate dielectric layer wraps around the channel region of the semiconductor wire structure.

6. The semiconductor device of claim 1, wherein a silicide layer is disposed between the source region and the source contact layer.

7. The semiconductor device of claim 1, wherein a bottom of the source contact layer is separated from the isolation insulating layer by the insulating layer.

8. A semiconductor device, comprising:
a first semiconductor wire structure horizontally extending and having a channel region, and a source region and a drain region, which are disposed at ends of the channel region in a horizontal direction; and
a second semiconductor wire structure horizontally extending and having a channel region, and a source region and a drain region, which are disposed at ends of the channel region in a horizontal direction, wherein:
a source contact layer is formed over the source region of the first semiconductor wire structure and the source region of the second semiconductor wire structure,
the source contact layer is embedded in a dielectric layer,
an isolation insulating layer is disposed between the dielectric layer and a substrate,
a bottom of the source region of the first semiconductor wire structure and a bottom of the source region of the second semiconductor wire structure are separated from the substrate by an insulating layer made of a different material than the isolation insulating layer and the dielectric layer,
a bottom of the drain region of the first semiconductor wire structure and a bottom of the drain region of the second semiconductor wire structure are separated from the substrate by the insulating layer,
the substrate includes a first protrusion below the source region of the first semiconductor wire structure and a second protrusion below the source region of the second semiconductor wire structure, and
the insulating layer is disposed between the bottom of the source region of the first semiconductor wire structure and the first protrusion and between the bottom of the source region of the second semiconductor wire structure and the second protrusion.

9. The semiconductor device of claim 8, wherein the insulating layer is made of SiCO.

10. The semiconductor device of claim 8, wherein:
the substrate includes a first protrusion below the source region of the first semiconductor wire structure and a second protrusion below the source region of the second semiconductor wire structure, and
the insulating layer is disposed between the bottom of the source region of the first semiconductor wire structure and the first protrusion and between the bottom of the source region of the second semiconductor wire structure and the second protrusion.

11. The semiconductor device of claim 8, the first and second semiconductor wire structures and the substrate are made of a same material.

12. The semiconductor device of claim 8, the first and second semiconductor wire structures and the substrate are made of different materials.

13. The semiconductor device of claim 8, wherein:
a first silicide layer is disposed between the source region of the first semiconductor wire structure and the source contact layer, and
a second silicide layer is disposed between the source region of the second semiconductor wire structure and the source contact layer.

14. The semiconductor device of claim 8, wherein a bottom of the source contact layer is separated from the isolation insulating layer by the insulating layer.

15. A semiconductor device, comprising:
semiconductor wire structures horizontally extending over a substrate, each of which have a channel region, and a source region and a drain region, which are disposed at ends of the channel region in a horizontal direction, wherein:
a source contact layer is formed over the source region wrapping around the semiconductor wires,
the source contact layer is embedded in an dielectric layer,
an isolation insulating layer is disposed between the dielectric layer and the substrate,
a bottom of the source region is separated from the substrate by an insulating layer made of a different material than the isolation insulating layer and the dielectric layer, and a bottom of the drain region is separated from the substrate by the insulating layer,
the substrate includes a protrusion below the source region, and
the insulating layer is disposed between the bottom of the source/drain region and the protrusion.

16. The semiconductor device of claim 15, wherein the insulating layer is made of SiCO.

17. The semiconductor device of claim 15, wherein the protrusion continuously extends from the substrate and is made of a same material as the substrate.

18. The semiconductor device of claim 8, wherein the isolation insulating layer is made of silicon oxide.

19. The semiconductor device of claim 15, wherein a bottom of the source contact layer is separated from the isolation insulating layer by the insulating layer.

20. The semiconductor device of claim 15, wherein the dielectric layer is made of silicon oxide.

* * * * *